US011776988B2

(12) United States Patent
Choi et al.

(10) Patent No.: US 11,776,988 B2
(45) Date of Patent: Oct. 3, 2023

(54) MICRO LIGHT-EMITTING DISPLAY APPARATUS AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Kiho Kong, Suwon-si (KR); Nakhyun Kim, Yongin-si (KR); Dongho Kim, Seoul (KR); Junghun Park, Yongin-si (KR); Jinjoo Park, Yongin-si (KR); Eunsung Lee, Seoul (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 17/227,981

(22) Filed: Apr. 12, 2021

(65) Prior Publication Data
US 2022/0109022 A1    Apr. 7, 2022

(30) Foreign Application Priority Data
Oct. 5, 2020    (KR) .................... 10-2020-0128269

(51) Int. Cl.
H01L 27/15    (2006.01)
(52) U.S. Cl.
CPC .................... *H01L 27/156* (2013.01)
(58) Field of Classification Search
None
See application file for complete search history.

(56) References Cited

U.S. PATENT DOCUMENTS

| 9,978,808 B2 | 5/2018 | Schneider, Jr. et al. |
| 10,573,684 B2 | 2/2020 | Schubert et al. |
| (Continued) | | |

FOREIGN PATENT DOCUMENTS

| JP | 2019516251 A | 6/2019 |
| KR | 1020180133192 A | 12/2018 |
| KR | 1020190065752 A | 6/2019 |

OTHER PUBLICATIONS

Glas, F., "Critical dimensions for the plastic relaxation of strained axial heterostructures in free-standing nanowires", Physical Review B, The American Physical Society, vol. 74, 2006, pp. 121302-1-21302-4 (4 pages).
(Continued)

*Primary Examiner* — Robert K Carpenter
(74) *Attorney, Agent, or Firm* — Sughrue Mion, PLLC

(57) ABSTRACT

A micro light-emitting display apparatus and a method of manufacturing the same are disclosed The micro light-emitting display apparatus includes a first semiconductor layer, an isolation structure provided on the first semiconductor layer and configured to define a plurality of sub-pixels each configured to emit light, a first light-emitting unit including a first active layer provided in a first sub-pixel among the plurality of sub-pixels, and a second semiconductor layer provided on the first active layer, and a second light-emitting unit including a rod semiconductor layer provided in a second sub-pixel among the plurality of sub-pixels, a second active layer provided on the rod semiconductor layer, and a third semiconductor layer provided on the second active layer. The first active layer is configured to emit blue light and the second active layer is configured to emit green light.

18 Claims, 39 Drawing Sheets

(56) References Cited

U.S. PATENT DOCUMENTS

| | | |
|---|---|---|
| 10,586,829 B2 | 3/2020 | Yoo |
| 10,930,813 B2 | 2/2021 | Park et al. |
| 2009/0190371 A1* | 7/2009 | Root .................... G02B 6/4202 |
| | | 362/249.02 |
| 2017/0323925 A1 | 11/2017 | Schneider, Jr. et al. |
| 2018/0351035 A1 | 12/2018 | Chung et al. |
| 2019/0214529 A1 | 7/2019 | Ahmed |
| 2020/0075801 A1 | 3/2020 | Chung et al. |
| 2020/0083405 A1 | 3/2020 | Choi et al. |
| 2020/0127173 A1 | 4/2020 | Park et al. |
| 2020/0168663 A1 | 5/2020 | Choi et al. |
| 2021/0226092 A1 | 7/2021 | Choi et al. |
| 2021/0391499 A1 | 12/2021 | Kim et al. |
| 2021/0399173 A1 | 12/2021 | Choi et al. |

OTHER PUBLICATIONS

Karpov, S., "Suppression of phase separation in InGaN due to elastic strain", MRS Internet Journal Nitride Semiconductor Research, 1998, vol. 16, pp. 1-5 (6 pages).
Communication dated Jan. 4, 2022 issued by the European Patent Office in counterpart European Application No. 21180803.5.

* cited by examiner

MICRO LIGHT-EMITTING DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2020-0128269, filed on Oct. 5, 2020, in the Korean Intellectual Property Office, the disclosure of which is incorporated by reference herein in its entirety.

BACKGROUND

1. Field

Example embodiments of the disclosure relate to micro light-emitting display apparatuses capable of displaying color images and methods of manufacturing the same.

2. Description of the Related Art

Liquid crystal displays (LCDs) and organic light emitting diode (OLED) displays are widely used as display apparatuses. In recent years, a technology for manufacturing a high-resolution display apparatus using a micro light-emitting diode (LED) is receiving attention at least in part because the micro LEDs have low power consumption and are eco-friendly.

SUMMARY

Provided are micro light-emitting display apparatuses.

Provided are methods of manufacturing micro light-emitting display apparatuses.

Additional aspects will be set forth in part in the description which follows and, in part, will be apparent from the description, or may be learned by practice of the presented embodiments of the disclosure.

According to an aspect of the disclosure, there is provided a micro light-emitting display apparatus comprising: a first semiconductor layer; an isolation structure provided on the first semiconductor layer and configured to define a plurality of sub-pixels each configured to emit light; a first light-emitting unit including a first active layer provided in a first sub-pixel among the plurality of sub-pixels, and a second semiconductor layer provided on the first active layer; and a second light-emitting unit including a rod semiconductor layer provided in a second sub-pixel among the plurality of sub-pixels, a second active layer provided on the rod semiconductor layer, and a third semiconductor layer provided on the second active layer, wherein the first active layer is configured to emit blue light and the second active layer is configured to emit green light.

The rod semiconductor layer may comprise: a first portion having a constant width viewed along a height direction and a second portion where the width changes viewed along the height direction, wherein the second portion includes a first inclined surface, a second inclined surface facing the first inclined surface, and an upper surface between the first inclined surface and the second inclined surface.

An angle between a surface extending from the first inclined surface and the upper surface may range from about 47 degrees to about 57 degrees.

The rod semiconductor layer may include a same material as the first semiconductor layer.

A width D1 of the upper surface satisfies the following equation: $D1=D-2\times(h1/\tan \beta)$, where h1 is a height of the second portion, $\beta$ is an angle between the surface extending from the first inclined surface and the upper surface and D is a width of the first portion.

An aspect ratio (H/D) of the first portion satisfies $0.05 < H/D < 20$, where H is a height of the first portion and D is a width of the first portion.

The height H of the first portion satisfies $0.5\ \mu m < H < 20\ \mu m$.

The width D of the first portion satisfies $0.05\ \mu m < D < 2\ \mu m$.

The height h1 of the second portion is about 100 nm or less.

The micro light-emitting display apparatus may further comprise a third light-emitting unit configured to emit red light.

The third light-emitting unit may include a plurality of nanorod semiconductor layers arranged apart from each other on the first semiconductor layer, a third active layer, among a plurality of third active layers, provided on each of the plurality of nanorod semiconductor layers, and a fourth semiconductor layer, among a plurality of fourth semiconductor layer, provided on each of the third active layers.

Each of the nanorod semiconductor layers and each of the third active layers have a width in a range of about 10 nm to about 100 nm.

A pitch between the nanorod semiconductor layers is in a range of about 20 nm to about 300 nm.

Each of the nanorod semiconductor layers include an inclined surface and a flat surface.

The micro light-emitting display apparatus may further comprise fourth light-emitting unit configured to emit blue light, and a color conversion layer configured to convert the blue light emitted from the fourth light-emitting unit into red light.

The isolation structure may comprise an ion implantation area.

According to another aspect of the disclosure, there is provided a method of manufacturing a micro light-emitting display apparatus, the method comprising: forming a first active layer on a first semiconductor layer; forming a second semiconductor layer on the first active layer; forming a first isolation structure and a second isolation structure in the first active layers, the first isolation structure having a first width and the second isolation structure having a second width greater than the first width; forming a first layer on the first active layer, the first isolation structure, and the second isolation structure; exposing a first area of the second isolation structure; forming a regrowth area by etching the exposed first area of the second isolation structure; regrowing a semiconductor layer in the regrowth area; planarizing the semiconductor layer to form a rod semiconductor layer; forming a second active layer on the rod semiconductor layer; and forming a third semiconductor layer on the second active layer.

In the planarizing of the semiconductor layer, an etching solution including potassium hydroxide (KOH) or tetramethyl ammonium hydroxide (TMAH) is used.

The rod semiconductor layer may include a first portion having a constant width viewed along a height direction and a second portion where the width changes viewed along the height direction, wherein the second portion may include a first inclined surface, a second inclined surface facing the first inclined surface, and an upper surface between the first inclined surface and the second inclined surface.

An angle between a surface extending from the first inclined surface and the upper surface ranges from about 47 degrees to about 57 degrees.

A width D1 of the upper surface satisfies the following equation: $D1=D-2\times(h1/\tan\beta)$, where h1 is a height of the second portion, $\beta$ is an angle between the surface extending from the first inclined surface and the upper surface and D is a width of the first portion.

An aspect ratio (H/D) of the first portion satisfies $0.05<H/D<20$, where H is a height of the first portion and D is a width of the first portion.

The height H of the first portion satisfies $0.5\ \mu m<H<20\ \mu m$.

The height h1 of the second portion is about 100 nm or less.

The display apparatus further includes a third light-emitting unit configured to emit red light.

The third light-emitting unit includes a plurality of nanorod semiconductor layers arranged apart from each other on the first semiconductor layer, a third active layer, among a plurality of third active layers, provided on each of the plurality of nanorod semiconductor layers, and a fourth semiconductor layer, among a plurality of fourth semiconductor layer, provided on each of the third active layers.

Each of the nanorod semiconductor layers and each of the third active layers have a width in a range of about 10 nm to about 100 nm.

A pitch between the nanorod semiconductor layers is in a range of about 20 nm to about 300 nm.

According to another aspect of the disclosure, there is provided a method of manufacturing a micro light-emitting display apparatus, the method comprising: forming a first active layer on a first semiconductor layer; forming a second semiconductor layer on the first active layer; forming an isolation structure in the first active layer and the second semiconductor layer; etching an upper surface of the isolation structure to form an opening; forming a rod semiconductor layer in the opening; forming a second active layer on the rod semiconductor layer; and forming a third semiconductor layer on the second active layer.

According to another aspect of the disclosure, there is provided a micro light-emitting display apparatus comprising: a first semiconductor layer; an isolation structure provided on the first semiconductor layer; a first light-emitting unit provided on an upper surface of the first semiconductor to form a first sub-pixel, the first light-emitting unit including a first active layer and a second semiconductor layer provided on the first active layer; a second light-emitting unit provided in a first area of the isolation structure to form a second sub-pixel, the second light-emitting unit including a rod semiconductor layer, a second active layer provided on the rod semiconductor layer, and a third semiconductor layer provided on the second active layer, wherein the first active layer is configured to emit first light and the second active layer is configured to emit second light.

The micro light-emitting display apparatus may further comprise: a third light-emitting unit provided in a second area of the isolation structure to form a third sub-pixel, the third light-emitting unit including a plurality of nanorod semiconductor layers, a third active layer, among a plurality of third active layers, provided on each of the plurality of nanorod semiconductor layers, and a fourth semiconductor layer, among a plurality of fourth active layers, provided on each of the third active layers, wherein the third active layer is configured to emit third light.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1A:
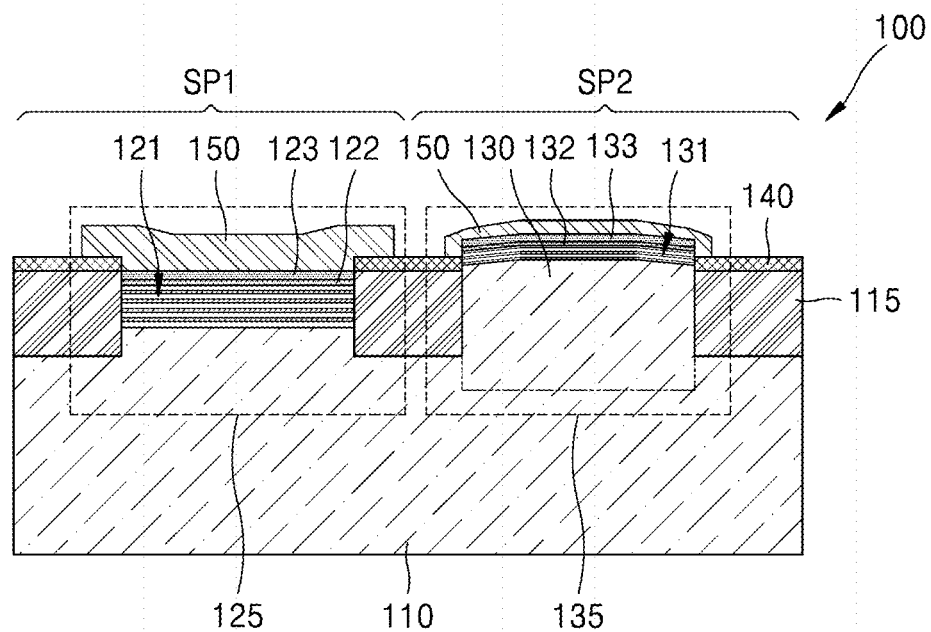
FIG. 1A is a view of a micro light-emitting display apparatus according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro light-emitting display apparatus and a method of manufacturing the same according to various example embodiments will be described in detail with reference to the accompanying drawings. The same reference numerals refer to the same elements throughout. In the drawings, the sizes of constituent elements may be exaggerated for clarity. It will be understood that, although the terms first, second, etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added. In addition, thicknesses or sizes of elements in the drawings are exaggerated for convenience and clarity of description. Furthermore, when an element is referred to as being "on" or "above" another element, it may be directly on the other element, or intervening elements may also be present. Moreover, the materials constituting each layer in the following example embodiments are merely examples, and other materials may be used.

In addition, the terms "-er", "-or", and "module" described in the specification mean units for processing at least one function and/or operation and can be implemented by hardware components or software components and combinations thereof.

The particular implementations shown and described herein are illustrative examples of the inventive concept and are not intended to otherwise limit the scope of the inventive concept in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a," "an," and "the" and similar referents is to be construed to cover both the singular and the plural.

Operations constituting a method may be performed in any suitable order unless explicitly stated that they should be performed in the order described. Further, the use of any and all examples, or exemplary language (e.g., "such as") provided herein, is intended merely to better illuminate the inventive concept and does not pose a limitation on the scope of the present disclosure unless otherwise claimed.

FIG. 1 is a schematic cross-sectional view of a micro light-emitting display apparatus according to an example embodiment.

A micro light-emitting display apparatus 100 includes a plurality of sub-pixels, and is configured to emit light using each of the plurality of sub-pixels. The micro light-emitting display apparatus 100 may include, for example, a first sub-pixel SP1 and a second sub-pixel SP2.

The micro light-emitting display apparatus 100 may include a first semiconductor layer 110, an isolation structure 115 provided on the first semiconductor layer 110 to define the plurality of sub-pixels, a first light-emitting unit 125 including a first active layer 121 configured to emit blue light in the first sub-pixel SP1 defined by the isolation structure 115, and a second light-emitting unit 135 including a rod semiconductor layer 130 provided in the second sub-pixel SP2 defined by the isolation structure 115 and a second active layer 131 provided on the rod semiconductor layer 130. According to an example embodiment, the isolation structure 115 may be provided on an upper surface of the first semiconductor layer 110.

The second light-emitting unit 135 may be configured to emit, for example, green light. The rod semiconductor layer 130 may be provided between isolation structures 115, and the second active layer 131 may be above the isolation structures 115.

The first semiconductor layer 110 may include a first type semiconductor. For example, the first semiconductor layer 110 may include an n-type semiconductor. Alternatively, the first semiconductor layer 110 may include a p-type semiconductor. The first semiconductor layer 110 may include a III-V group n-type semiconductor, for example, n-GaN. Alternatively, the first semiconductor layer 110 may include an AlN layer or an $Al_xGa_{(1-x)}N$ ($0 \leq x \leq 1$) layer. The first semiconductor layer 110 may have a single layer structure or a multilayer structure.

The first active layer 121 may be provided on the upper surface of the first semiconductor layer 110. The first active layer 121 may generate light while electrons and holes are combined. The first active layer 121 may have a multi-quantum well (MQW) structure or a single-quantum well (SQW) structure. The first active layer 121 may include a III-V group semiconductor, for example, GaN. The first active layer 121 may have, for example, a multi-quantum well structure in which InGaN layers and GaN layers are alternately stacked.

The first light-emitting unit 125 may further include a second semiconductor layer 123. The second semiconductor layer 123 may include a second type semiconductor layer. For example, the second semiconductor layer 123 may include a p-type semiconductor layer. When the first semiconductor layer 110 is n-type, the second semiconductor layer 123 may be p-type. The second semiconductor layer 123 may include, for example, a GaN layer, an AlN layer, or an $Al_xGa_{(1-x)}N$ ($0 \leq x \leq 1$) layer. For example, as a p-type dopant, for example, magnesium (Mg), calcium (Ca), zinc (Zn), cadmium (Cd), mercury (Hg), or the like may be used.

The second light-emitting unit 135 may include the rod semiconductor layer 130, the second active layer 131, and a third semiconductor layer 133. A first electrode 150 may be provided on the second semiconductor layer 123 and the third semiconductor layer 133, respectively. The first electrode 150 may be, for example, a pixel electrode capable of applying a voltage in sub-pixel units.

An electron blocking layer 122 may be further provided between the first active layer 121 and the second semiconductor layer 123. In addition, an electron blocking layer 132 may be further provided between the second active layer 131 and the third semiconductor layer 133. However, according to another example embodiment, the electron blocking layers 122 and 132 may be omitted.

Meanwhile, the isolation structure 115 may include, for example, an ion implantation area. Here, ions may include, for example, nitrogen (N) ions, boron (B) ions, argon (Ar) ions, or phosphorus (P) ions. Because no current is injected in the ion implantation area, light is not emitted, and when the isolation structure 115 is configured with the ion implantation area, a light-emitting unit may be formed without a mesa structure. That is, because the light-emitting unit is provided by the isolation structure 115, a micro light-emitting device array structure may be implemented without an etching process. In a case of using the etching process, there is a limit to reducing the size of sub-pixels. However, because the isolation structure 115 does not require the use of the etching process, it is possible to manufacture a small-sized sub-pixel, thereby manufacturing a high-resolution micro light-emitting device array.

Figure 1B:
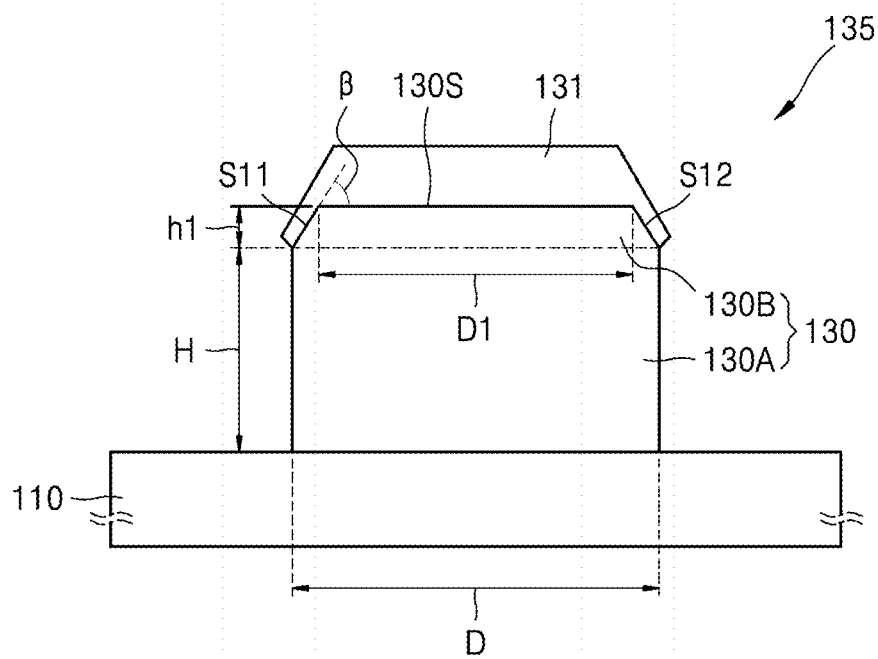
FIG. 1B is an enlarged view of a green light-emitting unit of a micro light-emitting display apparatus according to an example embodiment.

FIG. 1B is a conceptual diagram illustrating an enlarged second light-emitting unit 135.

The first semiconductor layer 110 may be a doped material layer or an updoped material layer. In an example, the first semiconductor layer 110 may be a doped GaN layer or an undoped GaN layer. The rod semiconductor layer 130 may include a first portion 130A having a constant width and a second portion 130B having a variable width, wherein the second portion 130B may include a first inclined surface S11, a second inclined surface S12 facing the first inclined surface S11, and an upper surface 130S between the first inclined surface S11 and the second inclined surface S12. For example, the upper surface 130S may be flat. For example, the upper surface 130S may be a plane parallel to the first semiconductor layer 110. The rod semiconductor layer 130 may include, for example, a GaN layer, an AlN layer, or an Al$_x$Ga(1-x)N (0≤x≤1) layer. The rod semiconductor layer 130 may include the same material as that of the first semiconductor layer 110.

The second active layer 131 may be provided on the rod semiconductor layer 130.

The second portion 130B may have a narrower width as it goes upward. For convenience of explanation, the rod semiconductor layer 130 is divided into the first portion 130A and the second portion 130B, but the first portion and the second portion may be a single body of the same material and composition without having a physical boundary. The first portion 130A may have a given height H and a given diameter D. An aspect ratio of the first portion 130A, that is, a ratio (H/D) of the height H and the diameter D may be in a range of, for example, 0.05<H/D<20. The first portion 130A may have a diameter D that satisfies this aspect ratio. For example, the diameter D of the first portion 130A may be in a range of 0.05 μm<D<2 μm. In addition, the first portion 130A may have a height H that satisfies the aspect ratio. For example, the height H of the first portion 130A may be in a range of 0.5 μm<H<20 μm. The second portion 130B may be a portion regrown from the first portion 130A. The second portion 130B may include a first inclined surface S11 and a second inclined surface S12. The first and second inclined surfaces S11 and S12 may be symmetrical to each other with respect to the upper surface 130S. However, the disclosure is not limited thereto. In an example, a geometric shape of the second portion 130B viewed in plan may be a hexagonal shape. The first inclined surface S11 may have a given inclination angle β. The inclination angle β is an angle between a surface extending from the first inclined surface S11 and the upper surface 130S. The inclination angle β may be in a range of, for example, about 47 degrees to about 57 degrees. Because the second portion 130B has a narrower width as it goes upward, the width D1 of the upper surface 130S may be narrower than the diameter D of the first portion 130A. The width D1 of the upper surface 130S may satisfy the following equation.

$$D1 = D - 2 \times (h1/\tan \beta) \quad \text{<Equation 1>}$$

Here, D is the diameter of the first portion 130A, h1 is the height of the second portion 130B, and β is the inclination angle. The second active layer 131 may be provided on the second portion 130B. The second active layer 131 may cover the upper surface 130S and the first and second inclined surfaces S11 and S12. The upper surface 130S may be flat. When the second active layer 131 is grown on the flat upper surface 130S, the thickness and composition of the second active layer 131 may be uniform. The second active layer 131 may include an InGaN/GaN layer, but the disclosure is not limited thereto. When the second active layer 131 is grown on the flat upper surface 130S, indium (In) distribution uniformity of the second active layer 131 may be relatively higher than when the second active layer 131 is grown on a non-flat surface. When composition distribution and thickness uniformity of the second active layer 131 is high, high-efficiency green light having a narrow full width at half maximum (FWHM) may be emitted.

Figure 2:
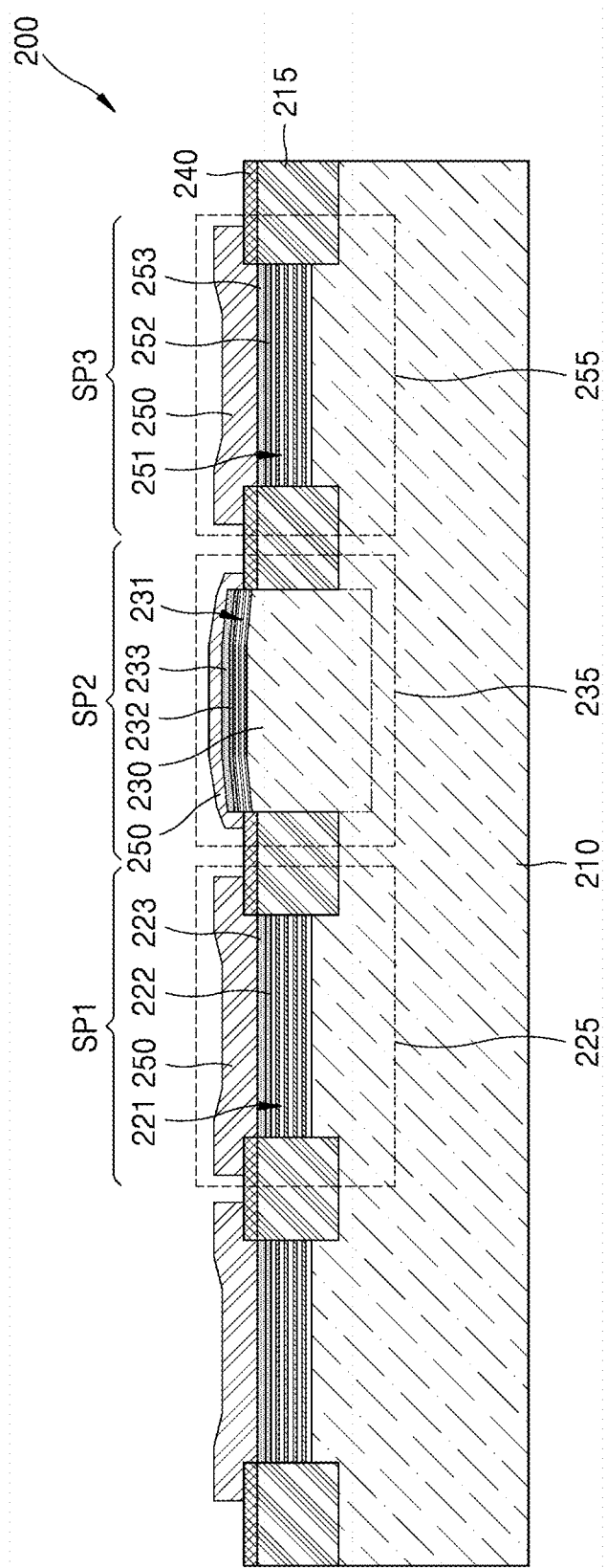
FIG. 2 is a view of a micro light-emitting display apparatus according to another example embodiment.

FIG. 2 is a view of a micro light-emitting display apparatus according to another example embodiment.

A micro light-emitting display apparatus 200 may include a first semiconductor layer 210, and an isolation structure 215 provided on the first semiconductor layer 210. The isolation structure 215 is configured to define the first sub-pixel SP1, the second sub-pixel SP2, and a third sub-pixel SP3. According to an example embodiment, the isolation structure 215 may be provided on an upper surface of the first semiconductor layer 210. The micro light-emitting display apparatus 200 may further include a first light-emitting unit 225 configured to emit blue light in the first sub-pixel SP1, a second light-emitting unit 235 configured to emit green light in the second sub-pixel SP2, and a third light-emitting unit 255 configured to emit blue light in the third sub-pixel SP3.

The first light-emitting unit 225 may include the first semiconductor layer 210, a first active layer 221, and a second semiconductor layer 223. An electron blocking layer 222 may be further provided between the first active layer 221 and the second semiconductor layer 223. The first light-emitting unit 225 has substantially the same configuration and operation as those of the first light-emitting unit 125 described with reference to FIG. 1, and thus a detailed description thereof will not be given herein. The second light-emitting unit 235 may include a rod semiconductor layer 230, a second active layer 231, and a third semiconductor layer 233. An electron blocking layer 232 may be further provided between the second active layer 231 and the third semiconductor layer 253. The second light-emitting unit 235 has substantially the same configuration and operation as those of the second light-emitting unit 135 described with reference to FIGS. 1A and 1B.

The third light-emitting unit 255 may include the first semiconductor layer 210, a third active layer 251, and a fourth semiconductor layer 253. The third light-emitting unit 255 may be configured to emit blue light. The third light-emitting unit 255 may be configured substantially the same as the first light-emitting unit 225. An electron blocking layer 252 may be further provided between the third active layer 251 and the fourth semiconductor layer 253.

A first electrode 250 may include a reflective material to reflect light emitted from the first active layer 221, the second active layer 231, and the third active layer 251. The first electrode 250 may include, for example, Ag, Au, Al, Cr, or Ni, or an alloy thereof. The first electrode 250 is a pixel electrode and may independently drive a sub-pixel. The first electrodes 250 may be arranged apart from each other, and may be arranged to face the first active layer 221, the second active layer 231, and the third active layer 251, respectively. A current blocking layer 240 may be further provided at both ends of the first electrode 250. The current blocking layer 240 may prevent leakage of current to other adjacent sub-pixel areas. The current blocking layer 240 may include, for example, silicon oxide or silicon nitride. The current blocking layer 240 may be provided to overlap at least partially between one surface of the isolation structure 215 and the first electrode 250. The current blocking layer 240 may be arranged to correspond to the isolation structure 215.

According to an example embodiment, the first sub-pixel SP1 emits blue light, the second sub-pixel SP2 emits green light, and the third sub-pixel SP3 emits blue light. A full-color image may be displayed by converting the blue light emitted from the third sub-pixel SP3 into red light. This will be described later below.

Figure 3:
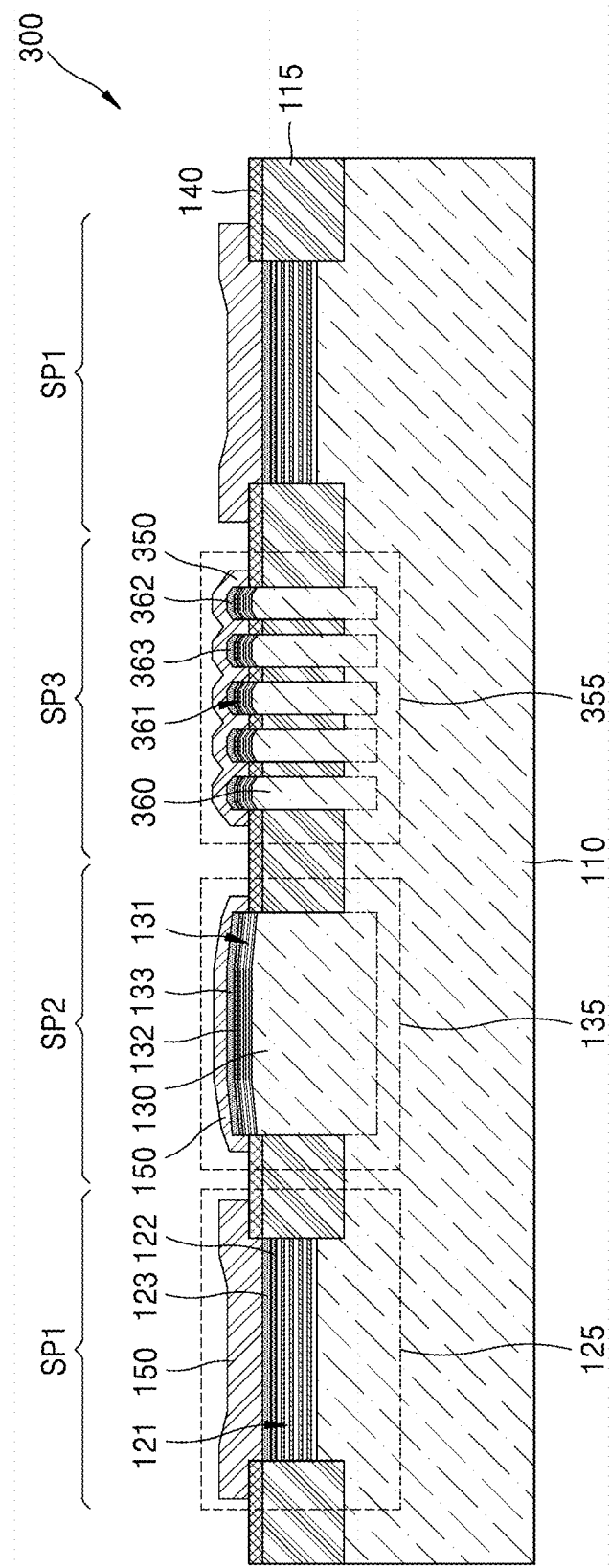
FIG. 3 is a view of a micro light-emitting display apparatus according to another example embodiment.

FIG. 3 is a view of a micro light-emitting display apparatus according to another example embodiment.

A micro light-emitting display apparatus 300 may include the first semiconductor layer 110, the isolation structure 115 configured to define the first sub-pixel SP1, the second sub-pixel SP2, and the third sub-pixel SP3 that are provided apart from each other on the first semiconductor layer 110, the first light-emitting unit 125 configured to emit blue light in the first sub-pixel SP1, the second light-emitting unit 135 configured to emit green light in the second sub-pixel SP2, and a third light-emitting unit 355 configured to emit red light in the third sub-pixel SP3.

Components using the same reference numerals as those used in FIGS. 1A and 1B in the example embodiment are substantially the same as those described with reference to FIGS. 1A and 1B, and thus detailed descriptions thereof will not be given herein.

The third light-emitting unit 355 may include a plurality of nanorod semiconductor layers 360 arranged to be apart from each other on the first semiconductor layer 110, a third active layer 361 provided on the plurality of nanorod semiconductor layers 360, and a fourth semiconductor layer 363 provided on the third active layer 361. An electron blocking layer 362 may be further provided between the third active layer 361 and the fourth semiconductor layer 363. According to an example embodiment, the plurality of nanorod semiconductor layers 360 may be arranged to be apart from each other on an upper surface of the first semiconductor layer 110.

Figure 4:
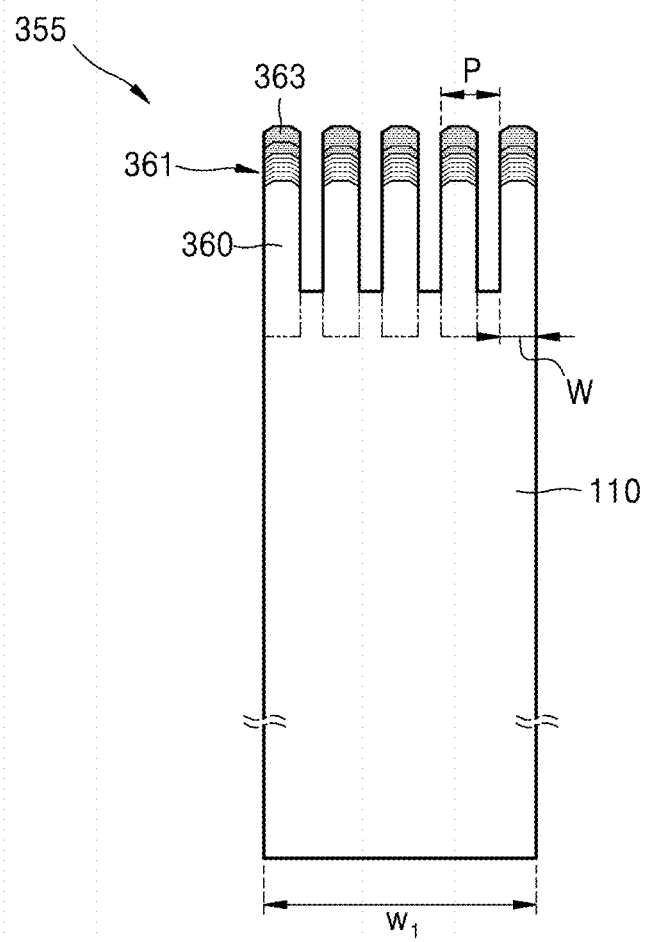
FIG. 4 is a view of a red light-emitting unit of a micro light-emitting display apparatus according to another example embodiment.

FIG. 4 is an enlarged view of the third light-emitting unit 355. According to an example embodiment illustrated in FIG. 4, the electron blocking layer 362 is omitted.

The first semiconductor layer 110 may include, for example, an n-type semiconductor. However, the disclosure is not necessarily limited thereto, and according to another example embodiment, the first semiconductor layer 110 may include a p-type semiconductor. The first semiconductor layer 110 may include a III-V group n-type semiconductor, for example, n-GaN. The first semiconductor layer 110 may have a single layer structure or a multilayer structure. For example, the first semiconductor layer 110 may include any one of InAlGaN, GaN, AlGaN, InGaN, AlN, and InN, and may include a semiconductor layer doped with a conductive dopant such as silicon (Si), germanium (Ge), and tin (Sn).

The nanorod semiconductor layers 360 may be arranged apart from each other on the first semiconductor layer 110. A nanorod semiconductor layer 360 may include the same material as that of the first semiconductor layer 110. The nanorod semiconductor layer 360 may include an inclined surface and a flat surface thereon. Accordingly, the third active layer 361 may also include an inclined surface and a flat surface thereon. According to an example embodiment, the inclined surface may be provided on a side portion of the nanorod semiconductor layers 360 and the flat surface may be provided in a middle portion of the nanorod semiconductor layers 360.

The third active layer 361 may be provided on the nanorod semiconductor layer 360. The third active layer 361 may generate light while electrons and holes are combined, and may have an MQW structure or an SQW structure. The third active layer 361 may include a III-V group semiconductor, for example, InGaN, GaN, AlGaN, AlInGaN, or the like.

The fourth semiconductor layer 363 is provided on the third active layer 361 and may include a semiconductor layer of a different type from the nanorod semiconductor layer 360. For example, the fourth semiconductor layer 363 may include a p-type semiconductor layer. The fourth semiconductor layer 363 may include, for example, InAlGaN, GaN, AlGaN and/or InGaN, and may be a semiconductor layer doped with a conductive dopant such as Mg.

Hereinafter, a light-emitting operation of the third light-emitting unit 355 will be described. Light is emitted by the recombination of electrons and holes in an active layer. A wavelength of the emitted light may vary depending on the content of a material in the active layer. For example, the greater the In content, the greater the wavelength of the emitted light. For example, when the In content of the active layer is about 15%, the active layer may emit blue light of about 450 nm, and when the In content of the active layer is about 25%, the active layer may emit green light of about 520 nm. In addition, when the In content of the active layer is about 35%, the active layer may emit red light of about 630 nm.

On the other hand, in general, as the In content of the active layer increases and the wavelength of emitted light increases, the efficiency of a light-emitting diode decreases.

Figure 5:
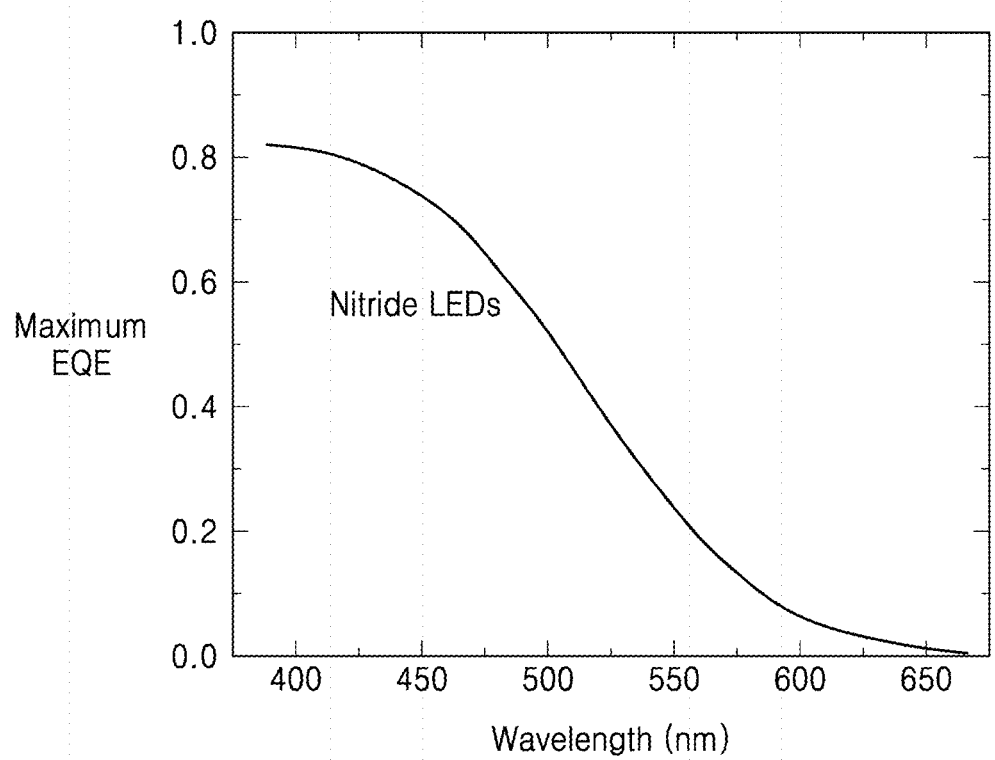
FIG. 5 is a graph showing luminous efficiency according to a wavelength of a general active layer.

FIG. 5 is a graph showing luminous efficiency according to a wavelength of a general active layer. As shown in FIG. 5, when the active layer is formed of a material emitting blue light of about 450 nm, the maximum value of external quantum efficiency is about 0.7. However, when the active layer is formed of a material emitting red light of about 630 nm, the maximum value of the external quantum efficiency becomes less than 0.1. This is because as the In content increases, a lattice mismatch between materials in the active layer, for example, InGaN and GaN, occurs. Such a lattice mismatch may cause strain or defects in the material in the active layer, and the strain may lead to phase separation of the active layer.

Figure 6A:
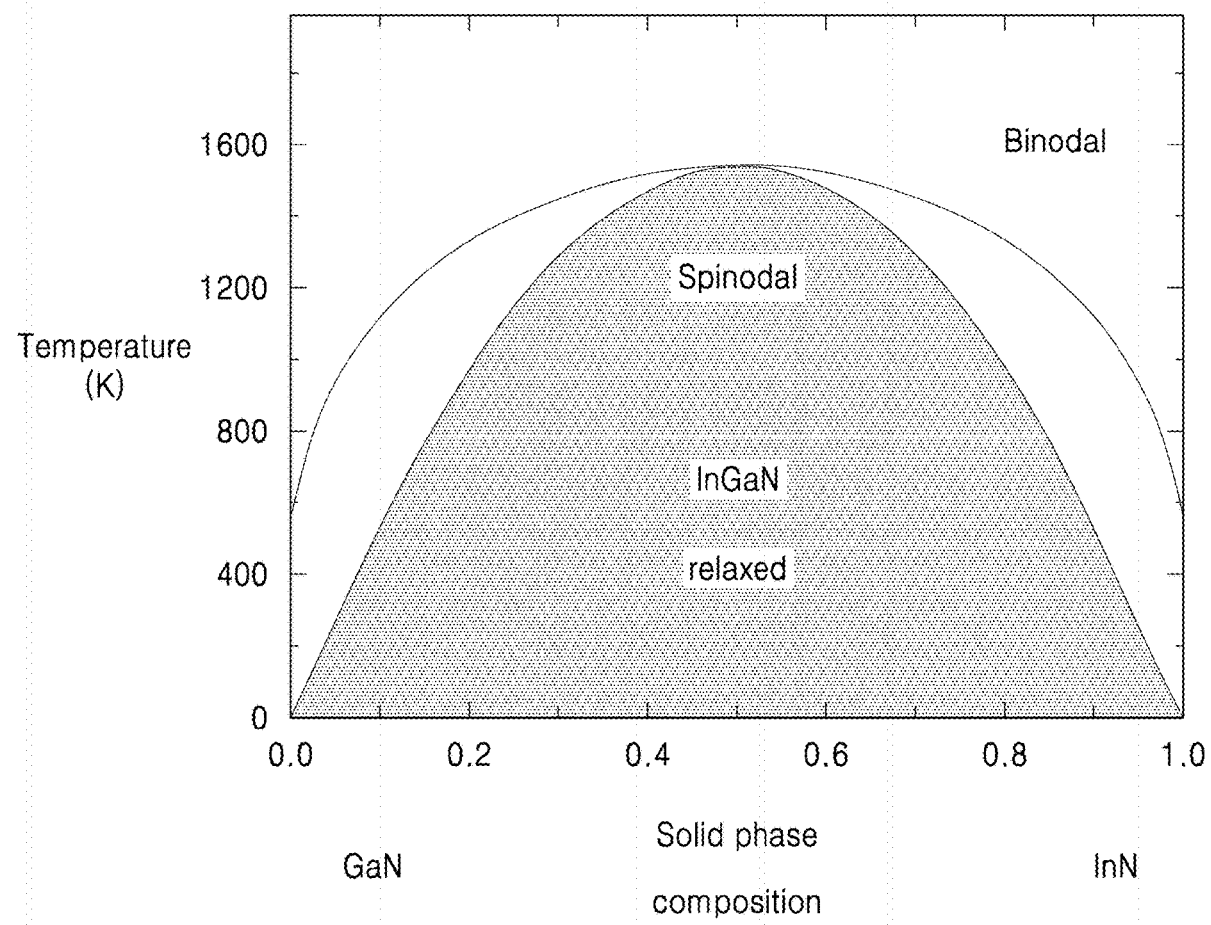
FIG. 6A is a graph showing a phase separation state according to a material content of $InxGa_{(1-y)}N$ in a relaxed state.
Figure 6B:
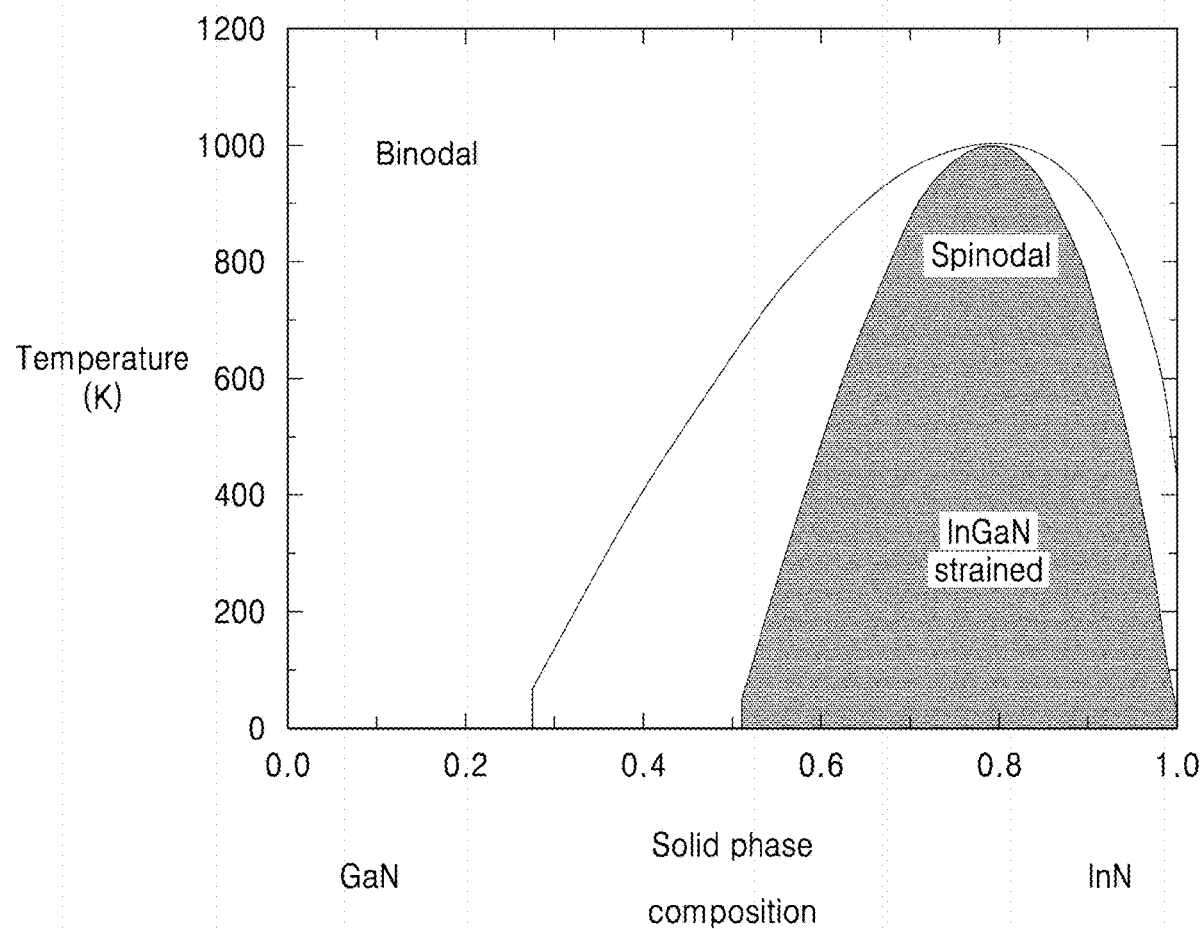
FIG. 6B is a graph showing a phase separation state according to a material content of $InxGa_{(1-y)}N$ in a strain state.

FIG. 6A is a graph showing a phase separation state according to the material content of $In_xGa_{(1-y)}N$ in a relaxed state, and FIG. 6B is a graph showing a phase separation state according to the material content of $In_xGa_{(1-y)}N$ in a strain state.

As shown in FIG. 6A, when $In_xGa_{(1-y)}N$ in a relaxed state includes the In content of 0.5 or less, depending on the temperature, $In_xGa_{(1-y)}N$ may be in a spinodal state or a binodal state. In particular, when the In content is about 0.3 to about 0.5, $In_xGa_{(1-y)}N$ is in a spinodal state in most of the temperature range. In the spinodal state, an active layer may become unstable, and a light-emitting diode including such an active layer may cause problems in a manufacturing process.

According to FIG. 6B, when $In_xGa_{(1-y)}N$ in a strain state includes the In content of 0.5 or less, for example, 0.3 to 0.5, the active layer is in a binodal state over all temperature ranges. Therefore, when the In content is less than 0.5 and in a strain state, it means that $In_xGa_{(1-y)}N$ may maintain a stable state regardless of temperature. This strain state occurs when the active layer has a lattice mismatch.

When the thickness or width of the active layer increases, the strain caused by the lattice mismatch may disappear as defects such as dislocation occur. Therefore, it is necessary to form an active layer in which defects do not occur while maintaining a strain state.

Figure 7:
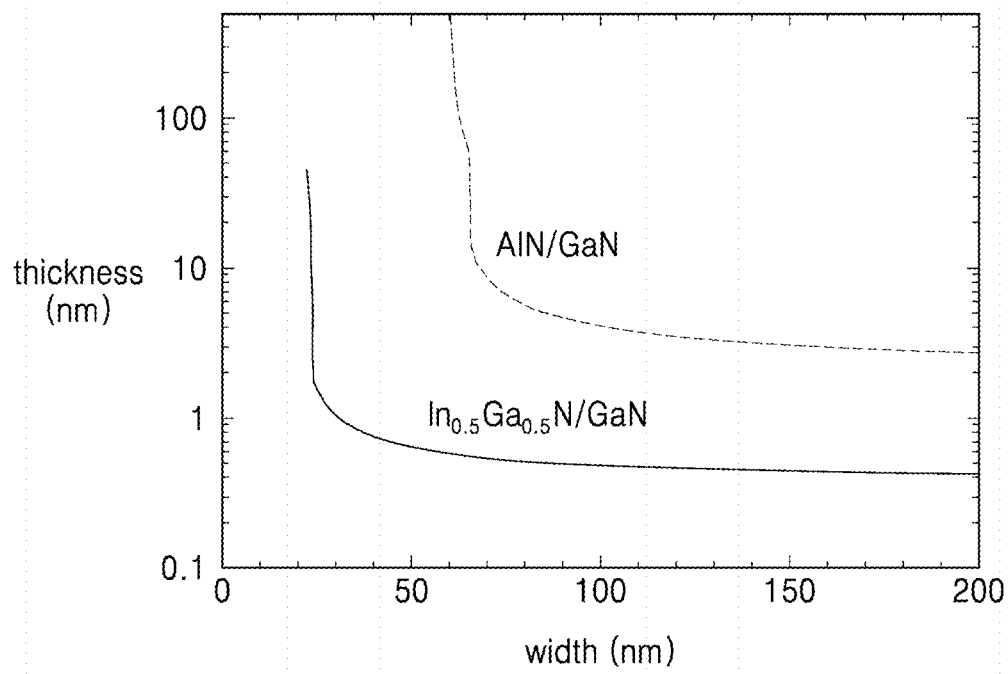
FIG. 7 is a view illustrating a relationship between a width and a thickness capable of maintaining a strain for each material of an active layer of a micro light-emitting display apparatus according to an example embodiment.

The width and thickness of the active layer in which phase separation does not occur while maintaining the strain state may be determined by lattice constants of materials in the active layer. FIG. 7 is a view illustrating a relationship between a width and a thickness capable of maintaining a strain for each material of an active layer of a micro light-emitting display apparatus according to an embodiment. As illustrated in FIG. 7, according to the material, the width and thickness of the active layer capable of maintaining a strain may vary. Also, even with the same material, the greater the width, the smaller the thickness that may maintain the strain. For example, when $In_{0.5}Ga_{0.5}N$ having a width of about 150 nm or more is to be stacked on a GaN layer, $In_{0.5}Ga_{0.5}N$ needs to be stacked to a thickness of about 0.5 nm or less to maintain the strain. However, stacking layers to a thickness of 0.5 nm or less may cause process difficulties.

In order to overcome such process difficulties, the strain may be maintained by reducing the width of the active layer. For example, in a case of stacking $In_{0.5}Ga_{0.5}N$ with a thickness of 1 nm or more, by forming a width of 30 nm or less, defect generation and phase separation may be reduced and the strain may be maintained. In particular, when materials having a large lattice mismatch are stacked, limiting a width may effectively reduce the occurrence of defects.

Referring back to FIG. 4, the nanorod semiconductor layer 360 and the third active layer 361 of the third light-emitting unit 355 according to an example embodiment may have a nano-sized width W. For example, the width W of the third active layer 361 may be in a range of about 10 nm or more and about 100 nm or less. In addition, a pitch P between the nanorod semiconductor layers 360 may be in a range of about 10 μm or less, for example, about 20 nm or more and about 300 nm or less. The thickness of the third active layer 361 may be in a range of 1 nm or more and 100 nm or less. In this way, by reducing the width W of the third active layer 361, even if a lattice mismatch in the third active layer 361 or a lattice mismatch between the nanorod semiconductor layer 360 and the third active layer 361 is large, the occurrence of defects may be reduced.

When the width and thickness of the third active layer 361 are adjusted, defects may be prevented even when the In content is high, so that light having high light efficiency may be emitted. For example, the third active layer 361 may include $In_xGa_{1-x}N$ (0≤x≤1), and the In content may be about 35% or more capable of emitting red light.

Meanwhile, the third light-emitting unit 355 may have a width $W_1$ of about 1 μm or less, for example, about 600 nm or less.

Because the nanorod semiconductor layer 360 serves as a seed layer when the third active layer 361 grows, and has a narrow width, even if there is a lattice mismatch between the nanorod semiconductor layer 360 and the third active layer 361, a defect may not occur. Accordingly, the third active layer 361 may efficiently emit red light.

Figure 8:
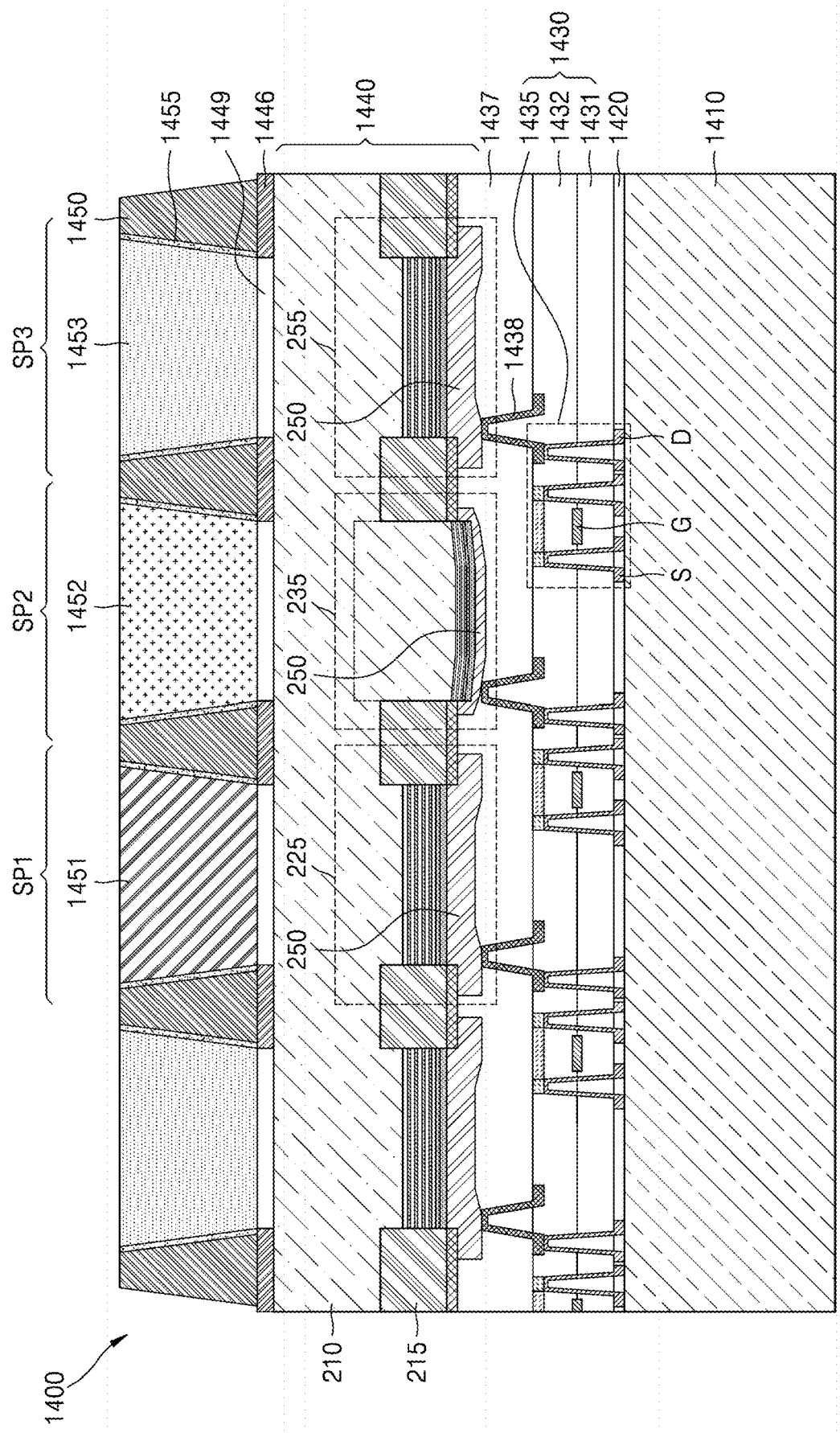
FIG. 8 is a view of a micro light-emitting display apparatus according to another example embodiment.

FIG. 8 shows a micro light-emitting display apparatus according to an example embodiment.

A micro light-emitting display apparatus 1400 may include the first sub-pixel SP1, the second sub-pixel SP2, and the third sub-pixel SP3. The first sub-pixel SP1, the second sub-pixel SP2, and the third sub-pixel SP3 may emit different color lights, respectively. The micro light-emitting display apparatus 1400 may include a support substrate 1410, a driving layer 1430 provided on the support substrate 1410, and a light-emitting layer 1440 provided on the driving layer 1430.

The support substrate 1410 may not be a substrate for growth but may be a substrate for supporting the driving layer 1430 thereon. For example, a silicon substrate, a glass substrate, a sapphire substrate, or a silicon substrate coated with $SiO_2$ may be used as the support substrate 1410. However, this is merely exemplary, and in addition to the substrate 210, various other materials may be used.

The driving layer 1430 may include a driving device 1435 for electrically driving the light-emitting layer 1440 for each sub-pixel. The driving device 1435 may include, for example, a transistor, a thin-film transistor (TFT), or a high electron mobility transistor (HEMT). For example, the driving device 1435 may include a gate electrode G, a source electrode S, and a drain electrode D. The driving layer 1430 may further include at least one insulating layer. For example, at least one insulating layer may include a first insulating layer 1431 and a second insulating layer 1432. The second insulating layer 1432 may be, for example, a gate oxide. A third insulating layer 1437 may be further provided between the driving layer 1430 and the light-emitting layer 1440.

A bonding layer 1420 may be provided between the support substrate 1410 and the driving layer 1430. The bonding layer 1420 is for bonding the driving layer 1430 to the support substrate 1410, and may include, for example, an adhesive layer or a direct bonding layer. The adhesive layer may include, for example, epoxy, spin on glass (SOG), or benzocyclobutene (BCB). The direct bonding layer may be formed by, for example, plasma or ion beam treatment. The bonding layer 1420 is for physically bonding the driving layer 1430 to the support substrate 1410, and the driving layer 1430 may be bonded to the support substrate 1410 by a bonding method that does not require electrical connection. The bonding layer 1420 may cover, for example, the source electrode S and the drain electrode D during a bonding process.

Meanwhile, the support substrate 1410 may be a substrate used for a complementary metal-oxide semiconductor (CMOS) backplane. In this case, the support substrate 1410 and the driving layer 1430 may constitute a CMOS backplane. When the support substrate 1410 and the driving layer 1430 constitute the CMOS backplane, the bonding layer 1420 may not be provided.

The light-emitting layer 1440 may include a micro light-emitting device array, for example, a micro LED array. The light-emitting layer 1440 may include the first light-emitting unit 225 that emits light of a first wavelength, for example, blue light, the second light-emitting unit 235 that emits light of a second wavelength, for example, green light, and the third light-emitting unit 255 that emits light of a third wavelength, for example, blue light. The first light-emitting unit 225, the second light-emitting unit 235, and the third light-emitting unit 255 are the same as those described with reference to FIG. 2, so detailed descriptions thereof will not be given herein, and reference numerals of the light-emitting units follow FIG. 2. In FIG. 8, reference numerals are omitted for convenience. In FIG. 8, the light-emitting layer 1440 is arranged in the reverse direction of the structure shown in FIG. 2.

The light-emitting layer 1440 may have the isolation structure 215 such that light from each of the active layers of the first light-emitting unit 225, the second light-emitting unit 235, and the third light-emitting unit 255 is emitted in sub-pixel units. In other words, the light-emitting layer 1440 may have the isolation structure 215 between neighboring sub-pixels.

The first electrode 250 electrically connected to each of the second semiconductor layer 223, the third semiconductor layer 233, and the fourth semiconductor layer 253 is provided, and a second electrode 1446 electrically connected to the first semiconductor layer 210 may be provided.

The first electrode 250 may be a pixel electrode, and the second electrode 1446 may be a common electrode. When the second, third, and fourth semiconductor layers 223, 233, and 253 include a p-type semiconductor, the first electrode 250 is a p-type electrode, and when the first semiconductor layer 210 includes an n-type semiconductor, the second electrode 446 may be an n-type electrode.

The driving device 1435 is electrically connected to the first electrode 250, and power of the first electrode 250 may be turned on and off by the driving device 1435. Therefore, the driving device 1435 may selectively drive at least one desired sub-pixel from among the first, second, and third sub-pixels SP1, SP2, and SP3.

The third insulating layer 1437 may be further provided between the driving layer 1430 and the light-emitting layer 1440. A via 1438 may be further provided on the third insulating layer 1437 so that the driving device 1435 and the first electrode 250 are electrically connected to each other.

The second electrode 1446 may be formed as a transparent electrode or an opaque electrode. The transparent electrode may include, for example, indium tin oxide (ITO), zinc oxide (ZnO), indium zinc oxide (IZO), or In—Ga—Zn—O (IGZO). When the second electrode 1446 is an opaque electrode, the second electrode 1446 may further include a window area 1449 such that light emitted from each active layer may be transmitted. The window area 1449 may be provided at a position corresponding to each active layer. When the second electrode 1446 is formed as a transparent electrode, the second electrode 1446 may be arranged to cover the entire first semiconductor layer 210 without a window area.

According to an example embodiment, from among lights emitted from the first light-emitting unit 225, the second light-emitting unit 235, and the third light-emitting unit 255, light directed downward may be reflected by the first electrode 250 and directed upward, and light emitted in a lateral direction from the first light-emitting unit 225, the second light-emitting unit 235, and the third light-emitting unit 255 may not be absorbed or scattered because there is no mesa structure in the isolation structure 215 and may go upward. Thus, the luminous efficiency may be improved. In addition, because the size of sub-pixels may be reduced by the isolation structure 215, the resolution may be increased. In addition, the present embodiment may have a vertical electrode structure in which the first electrode 250 and the second electrode 1446 are arranged vertically with respect to each active layer. Because the second electrode 1446 is arranged on the first semiconductor layer 210 and may be manufactured without a via hole process, an electrode may be formed without a mesa structure.

On the first semiconductor layer 210, a plurality of color conversion layers 1451, 1452, and 1453 emitting different color lights by lights emitted from the first, second and third light-emitting units 225, 235, and 255 may be provided. The first light-emitting unit 225 and the third light-emitting unit 255 may emit, for example, blue light. The second light-emitting unit 235 may emit, for example, green light. The color conversion layers 1451, 1452, and 1453 may be provided corresponding to the sub-pixels SP1, SP2, and SP3, respectively. The plurality of color conversion layers 1451, 1452, and 1453 may include, for example, a blue conversion layer, a green conversion layer, and a red conversion layer. The blue conversion layer 1451 may correspond to a blue sub-pixel, the green conversion layer 1452 may correspond to a green sub-pixel, and the red conversion layer 1453 may correspond to a red sub-pixel.

The blue conversion layer 1451 may include, for example, a material that emits blue light, or may be a transmission layer through which blue light emitted from the first light-emitting unit 225 passes.

The blue conversion layer 1451 may transmit blue light emitted from the first light-emitting unit 225 to be emitted to the outside. The blue conversion layer 1451 may further include a photoresist or a light scattering agent having good transmission characteristics.

The green conversion layer 1452 may include a material that emits green light emitted from the second light-emitting unit 235 or may be a transmission layer through which green light emitted from the second light-emitting unit 235 passes.

The red conversion layer 1453 may convert blue light emitted from the third light-emitting unit 255 into red light. The red conversion layer 1453 may include quantum dots (QD) of a certain size that are excited by blue light to emit red light. A quantum dot may have a core-shell structure having a core portion and a shell portion, and may also have a particle structure without a shell. The core-shell structure may have a single-shell or a multi-shell. The multi-shell may be, for example, a double-shell.

The quantum dot may include, for example, at least one of a group II-VI series semiconductor, a group III-V series semiconductor, a group IV-VI series semiconductor, a group IV series semiconductor, and a graphene quantum dot. As a specific example, the quantum dot may include at least one of Cd, selenium (Se), Zn, sulfur (S), and indium phosphide (InP), but is not limited thereto. Each quantum dot may have a diameter of tens of nm or less, for example, a diameter of about 10 nm or less. Further, the red conversion layer 1453 may include a phosphor that is excited by blue light to emit red light. Meanwhile, the red conversion layer 1453 may further include a photoresist having good transmission characteristics or a light scattering agent that uniformly emits green light.

The blue conversion layer 1451, the green conversion layer 1452, and the red conversion layer 1453 may have a cross-sectional shape in which the width increases toward the top. A partition 1450 may be between the adjacent color conversion layers 1451, 1452, and 1453. A reflective layer 1455 is further provided on a side surface of the partition 1450 to increase extraction efficiency of light converted from each color conversion layer. Alternatively, the partition 1450 may be formed of a black matrix for absorbing light. The black matrix may improve contrast by preventing crosstalk between the blue conversion layer 1451, the green conversion layer 1452, and the red conversion layer 1453.

Because blue light, green light, and red light are emitted from the first, second, and third sub-pixels SP1, SP2, and SP3, respectively, and the amount of light is controlled by the amount of current injected into the first electrode 250 and the second electrode 1446, a color image may be displayed. Even if the size of sub-pixels is reduced, light leakage to neighboring sub-pixels is reduced or prevented by an isolation structure, thereby increasing the resolution of a display apparatus. In addition, in the present embodiment, because a color conversion layer for converting to red light is provided among color conversion layers, and blue light and green light may be transmitted as it is, light efficiency may be improved and a manufacturing process of the color conversion layer may be reduced.

Figure 9:
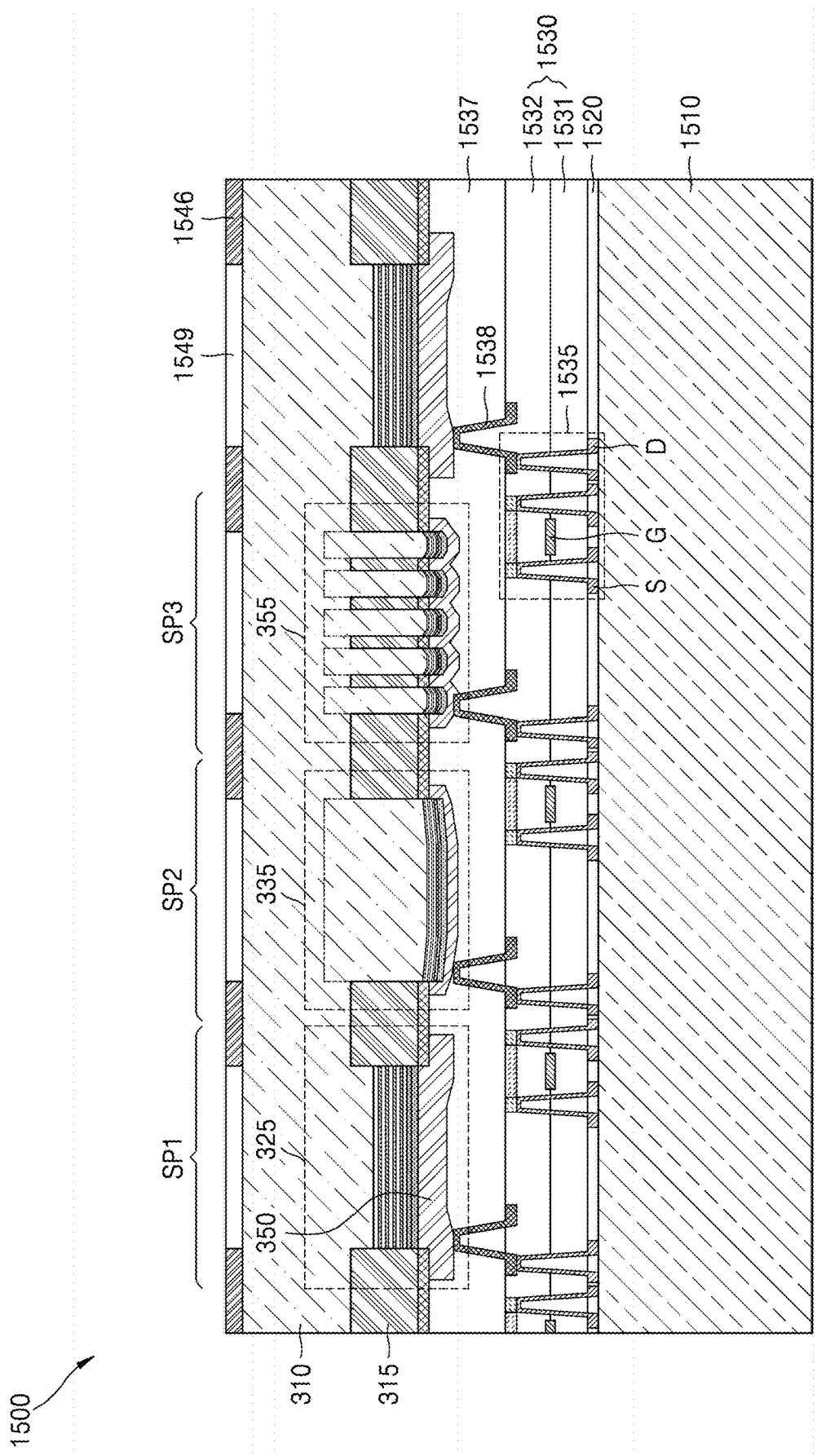
FIG. 9 is a view of a micro light-emitting display apparatus according to another example embodiment.

FIG. 9 is a view of a micro light-emitting display apparatus according to another embodiment.

A micro light-emitting display apparatus 1500 may include the first sub-pixel SP1, the second sub-pixel SP2, and the third sub-pixel SP3. The first sub-pixel SP1, the second sub-pixel SP2, and the third sub-pixel SP3 may emit different color lights, respectively. The micro light-emitting display apparatus 1500 may include a support substrate 1510, a driving layer 1530 provided on the support substrate 1510, and a light-emitting layer 1540 provided on the driving layer 1530.

The support substrate 1510 may not be a substrate for growth but may be a substrate for supporting the driving layer 1530 thereon. For example, a silicon substrate, a glass substrate, a sapphire substrate, or a silicon substrate coated with SiO$_2$ may be used as the support substrate 1510. The driving layer 1530 may include a driving device 1535 for electrically driving the light-emitting layer 1540 for each sub-pixel. The driving device 1535 may include, for example, a transistor, a TFT, or an HEMT. For example, the driving device 1535 may include a gate electrode G, a source electrode S, and a drain electrode D. The driving layer 1530 may further include at least one insulating layer. For example, at least one insulating layer may include a first insulating layer 1531 and a second insulating layer 1532. The second insulating layer 1532 may be, for example, a gate oxide. A third insulating layer 1537 may be further provided between the driving layer 1530 and the light-emitting layer 1540.

A bonding layer 1520 may be provided between the support substrate 1510 and the driving layer 1530. The bonding layer 1520 is for bonding the driving layer 1530 to the support substrate 1510, and may include, for example, an adhesive layer or a direct bonding layer.

The light-emitting layer 1540 may include a micro light-emitting device array, for example, a micro LED array. The light-emitting layer 1540 may include the first light-emitting unit 325 that emits light of a first wavelength, for example, blue light, the second light-emitting unit 335 that emits light of a second wavelength, for example, green light, and the third light-emitting unit 355 that emits light of a third wavelength, for example, green light. The first light-emitting unit 325, the second light-emitting unit 335, and the third light-emitting unit 355 are the same as those described with reference to FIG. 3, so detailed descriptions thereof will not be given herein, and reference numerals of the light-emitting units follow FIG. 3. In FIG. 9, reference numerals are omitted. In FIG. 9, the light-emitting layer 1540 is arranged in the reverse direction of the structure shown in FIG. 3.

The light-emitting layer 1540 may have an isolation structure 315 such that light from each of the active layers of the first light-emitting unit 325, the second light-emitting unit 335, and the third light-emitting unit 355 is emitted in sub-pixel units. That is, the first sub-pixel SP1, the second sub-pixel SP2, and the third sub-pixel SP3 may be defined by the isolation structure 315.

The first electrode 350 electrically connected to each of the second semiconductor layer 323, a third semiconductor layer 333, and a fourth semiconductor layer 353 is provided, and a second electrode 1546 electrically connected to a first semiconductor layer 310 may be provided. The first electrode 350 may be a pixel electrode, and the second electrode 1546 may be a common electrode. When the second, third, and fourth semiconductor layers 323, 333, and 353 include a p-type semiconductor, the first electrode 350 is a p-type electrode, and when the first semiconductor layer 310 includes an n-type semiconductor, the second electrode 1546 may be an n-type electrode.

The driving device 1535 is electrically connected to the first electrode 350, and power of the first electrode 350 may be turned on and off by the driving device 1535. Therefore, the driving device 1535 may selectively drive at least one desired sub-pixel from among the first, second, and third sub-pixels SP1, SP2, and SP3.

The third insulating layer 1537 may be further provided between the driving layer 1530 and the light-emitting layer 1540. A via 1538 may be further provided on the third insulating layer 1537 so that the driving device 1535 and the first electrode 350 are electrically connected to each other.

The second electrode 1546 may be formed as a transparent electrode or an opaque electrode. The transparent electrode may include, for example, indium ITO, ZnO, IZO, or IGZO. When the second electrode 1546 is an opaque electrode, the second electrode 1546 may further include a window area 1549 such that light emitted from each active layer may be transmitted. The window area 1549 may be provided at a position corresponding to each active layer. When the second electrode 1546 is formed as a transparent electrode, the second electrode 1546 may be arranged to cover the entire first semiconductor layer 310 without a window area.

Because blue light, green light, and red light are emitted from the first, second, and third sub-pixels SP1, SP2, and SP3, respectively, and the amount of light is controlled by the amount of current injected into the first electrode 350 and the second electrode 1546 in the present disclosure, a color image may be displayed. In the present embodiment, because a color image may be displayed without a color conversion layer or a color filter layer, it is possible to increase light efficiency and increase the efficiency of a manufacturing process.

FIGS. 10 to 24 are views for explaining a method of manufacturing a micro light-emitting display according to an example embodiment.

Figure 10:
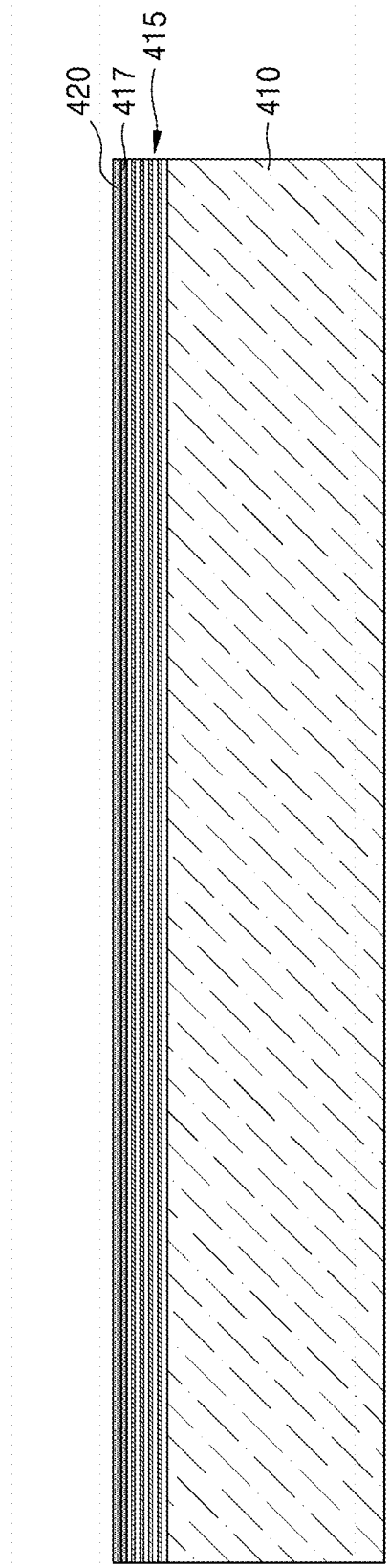
FIGS. 10 to 24 are views illustrating a method of manufacturing a micro light-emitting display apparatus according to an example embodiment.

Referring to FIG. 10, a first layer 415 is formed on a first semiconductor layer 410. The first semiconductor layer 410 may include an n-type semiconductor layer. However, in some cases, the first semiconductor layer 410 may include a p-type semiconductor layer. For example, the first semiconductor layer 410 may include n-type GaN. The first layer 415 is a layer on which an active layer is to be formed, and may include, for example, GaN. A second semiconductor layer 420 is formed on the first layer 415. The second semiconductor layer 420 may include, for example, a p-type semiconductor layer. The second semiconductor layer 420 may include, for example, p-type GaN.

According to an example embodiment, an electron blocking layer 417 may be further formed between the first layer 415 and the second semiconductor layer 420. The electron blocking layer 417 may include, for example, AlGaN. According to an example embodiment, the second semiconductor layer 420 is formed on the electron blocking layer 417.

Figure 11:
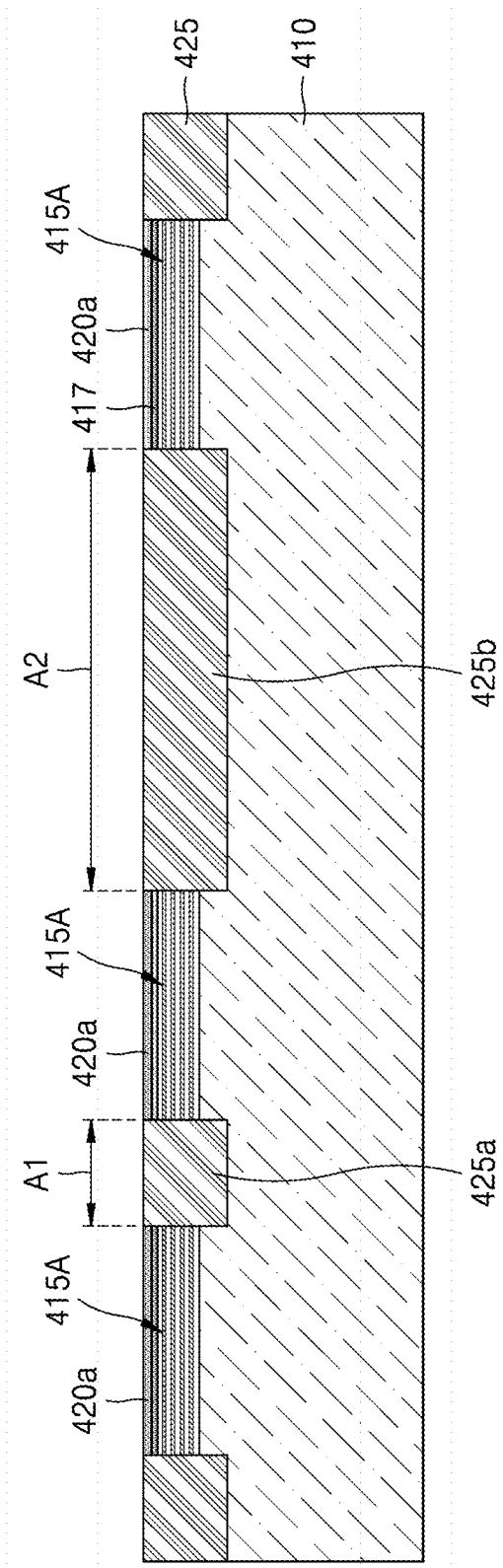

Referring to FIG. 11, an isolation structure 425 may be formed on the first layer 415, the electron blocking layer 417, and the second semiconductor layer 420 by using a mask. The mask may be, for example, an ion implantation mask. For example, the isolation structure 425 may be formed by implanting ions into certain areas of the first layer 415 and the second semiconductor layer 420. According to an example embodiment, the isolation structure 425 may be formed by implanting ions into certain areas of the first layer 415, the electron blocking layer 417, and the second semiconductor layer 420. Ions may include, for example, N ions, B ions, Ar ions, or P ions. However, ions are not limited thereto. A thickness of the isolation structure 425 may vary. The isolation structure 425 may include, for example, a first isolation structure 425a having a first width A1 and a second isolation structure 425b having a second width A2. The second width A2 may be greater than the first width A1.

A plurality of first active layers 415A that are spaced apart from each other by the isolation structure 425, may be formed. Further, a plurality of second semiconductor layers 420a that are spaced apart from each other by the isolation structure 425a may be formed. Each of the plurality of first active layers 415A and each of the plurality of second semiconductor layers 420a provided apart from each other may define a sub-pixel area. Each of the plurality of first active layers 415A may include a multi-quantum well structure in which InGaN layers and GaN layers are alternately stacked. The isolation structure 425 may form a micro light-emitting structure array, for example, a micro LED array.

Figure 12:
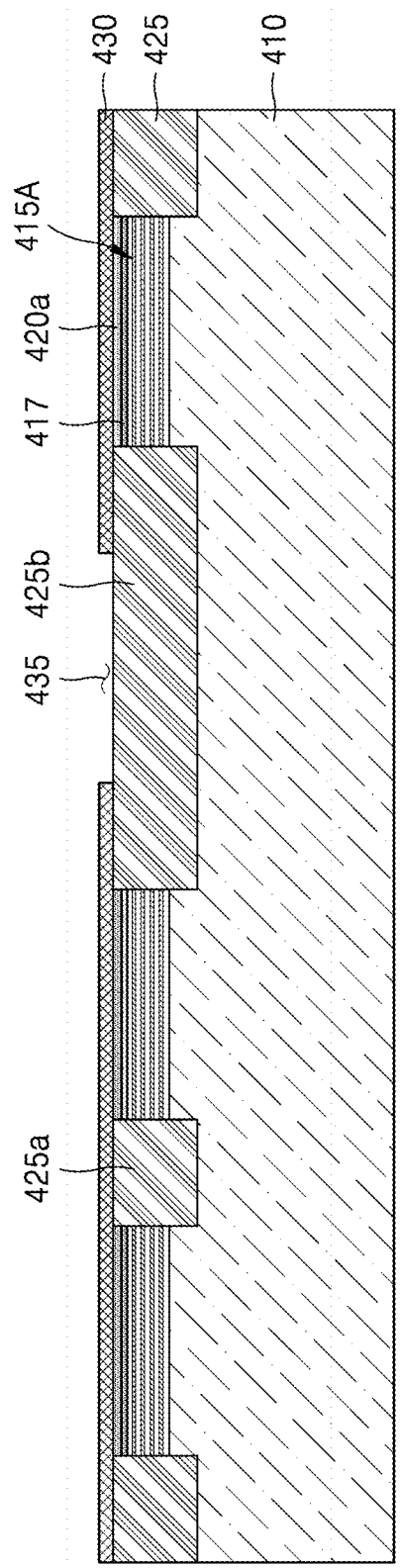

Referring to FIG. 12, a second layer 430 may be deposited on the second semiconductor layers 420a and the isolation structure 425. The second layer 430 may be formed through a photoresist and etching process. The second layer 430 may include, for example, an insulating material. The second layer 430 may function as a current blocking layer. The second layer 430 is patterned so that a first area 435 of the second isolation structure 425b is opened.

Figure 13:
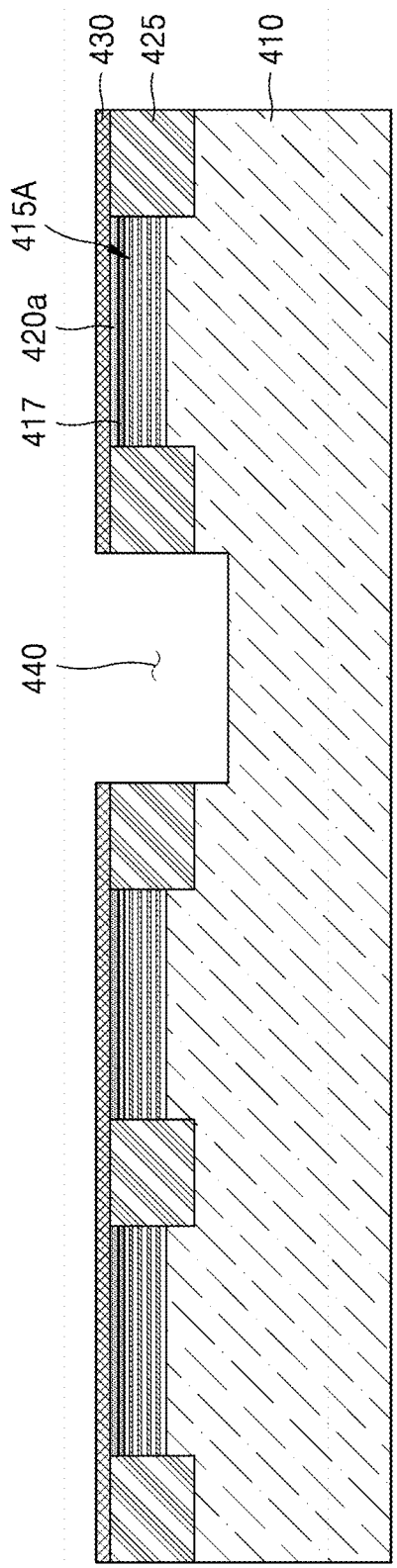

Referring to FIG. 13, a regrowth area 440 may be formed by etching the exposed first area 435 of the second isolation structure 425b. The regrowth area 440 may be formed to a depth penetrating the second isolation structure 425.

Figure 14:
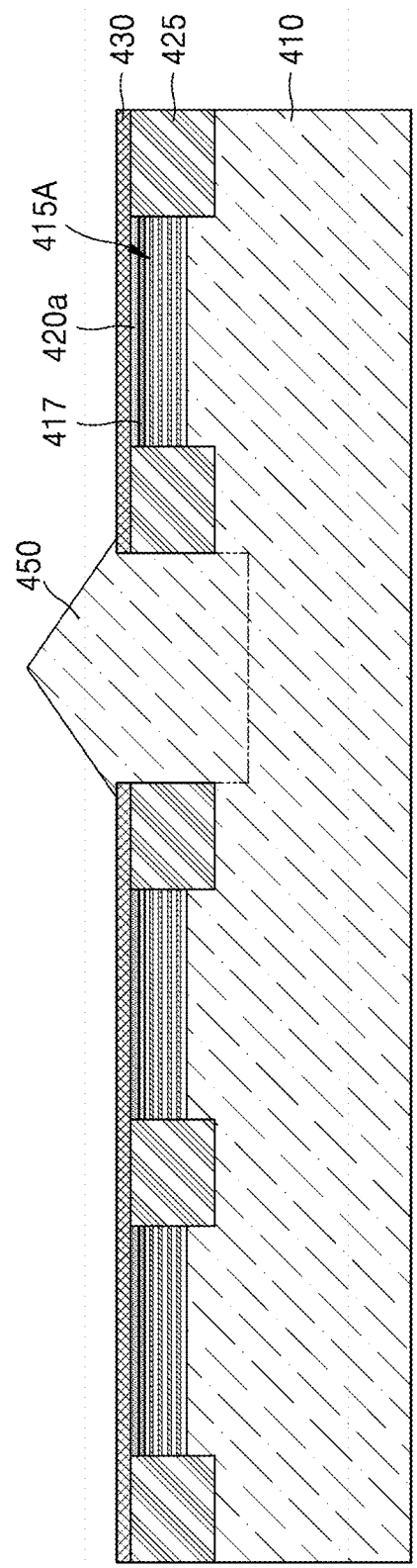

Referring to FIG. 14, a semiconductor layer 450 is regrown in the regrowth area 440. The semiconductor layer 450 may include, for example, the same material as the material of the first semiconductor layer 410. The semiconductor layer 450 may include, for example, n-type GaN. A thickness of a central portion of the semiconductor layer 450 may be greater than that of a peripheral portion according to a difference in growth rate. The semiconductor layer 450 may have a sharp central portion.

Figure 15:
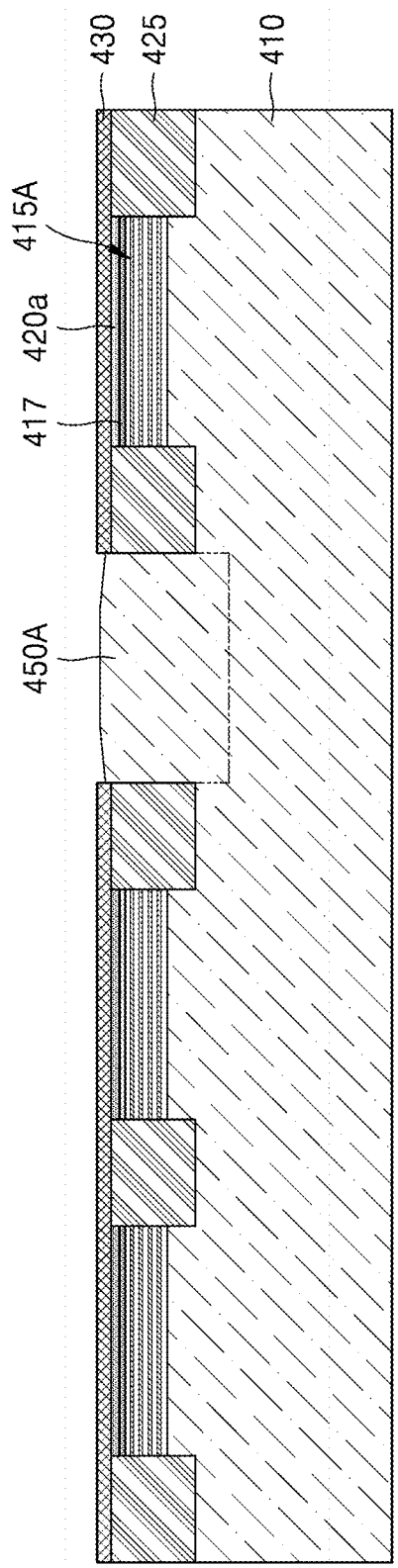

Referring to FIG. 15, the semiconductor layer 450 may be planarized or flattened to form a rod semiconductor layer 450A. The semiconductor layer 450 may be planarized by etching, for example, with an etching solution of KOH or TMAH. In addition, the planarized semiconductor layer may be regrown to form the rod semiconductor layer 450A. By regrowing the planarized semiconductor layer, a plane may be formed on an upper surface of the rod semiconductor layer 450A. The rod semiconductor layer 450A may have, for example, a truncated pyramid shape. However, the shape of the rod semiconductor layer 450A is not limited thereto, and as such, according to another example embodiment, the rod semiconductor layer 450A may have a different shape. Because the rod semiconductor layer 450A is substantially the same as the configuration described with reference to FIG. 1B, a detailed description thereof will not be given herein.

Figure 16:
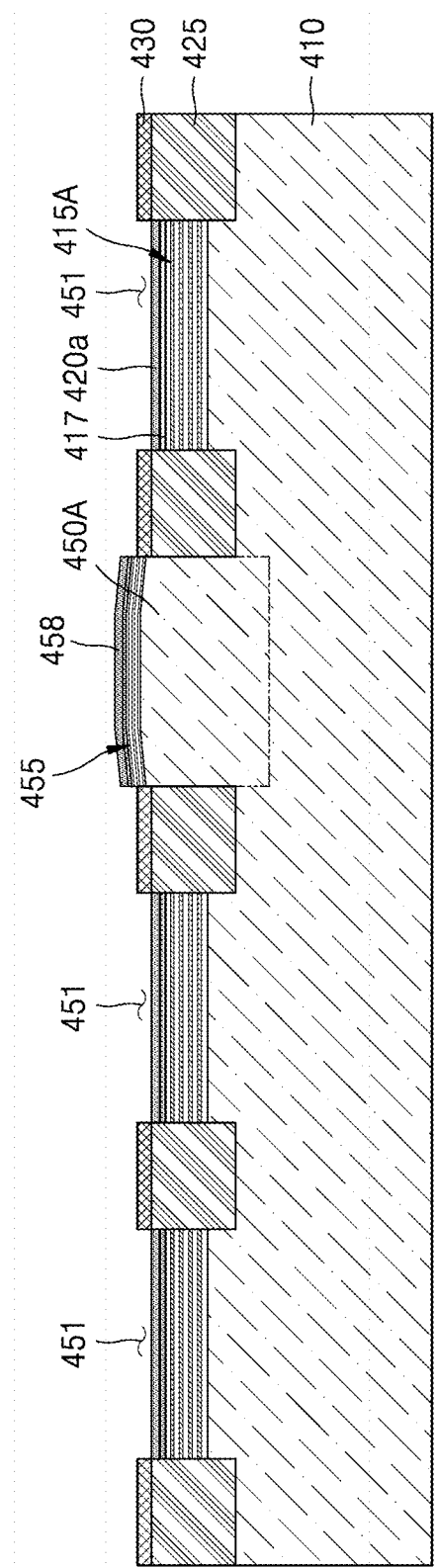

Referring to FIG. 16, a second active layer 455 may be formed on the rod semiconductor layer 450A, and a third semiconductor layer 458 may be formed on the second active layer 455. The second active layer 455 may have an MQW structure or an SQW structure. The second active layer 455 may include a III-V group semiconductor, for example, GaN. The second active layer 455 may have a GaN/InGaN multiple quantum well structure. For example, the second active layer 455 may include a multi-quantum well structure in which InGaN layers and GaN layers are alternately stacked. The second active layer 455 may be configured to emit green light by adjusting, for example, the composition and the uniformity of thickness of In. In the second active layer 455, the uniformity of the composition and thickness of In is increased through a planarization process and a regrowth process, thereby reducing an FWHM of a wavelength of green light and emitting green light with high purity.

The third semiconductor layer 458 may include a p-type semiconductor. The third semiconductor layer 458 may include a III-V group p-type semiconductor, for example, p-GaN. The third semiconductor layer 458 may have a single layer structure or a multilayer structure.

After the third semiconductor layer 458 is formed, the second layer 430 may be patterned to expose plurality of second areas 451 in which the plurality of first active layers 415A is formed.

Figure 17:
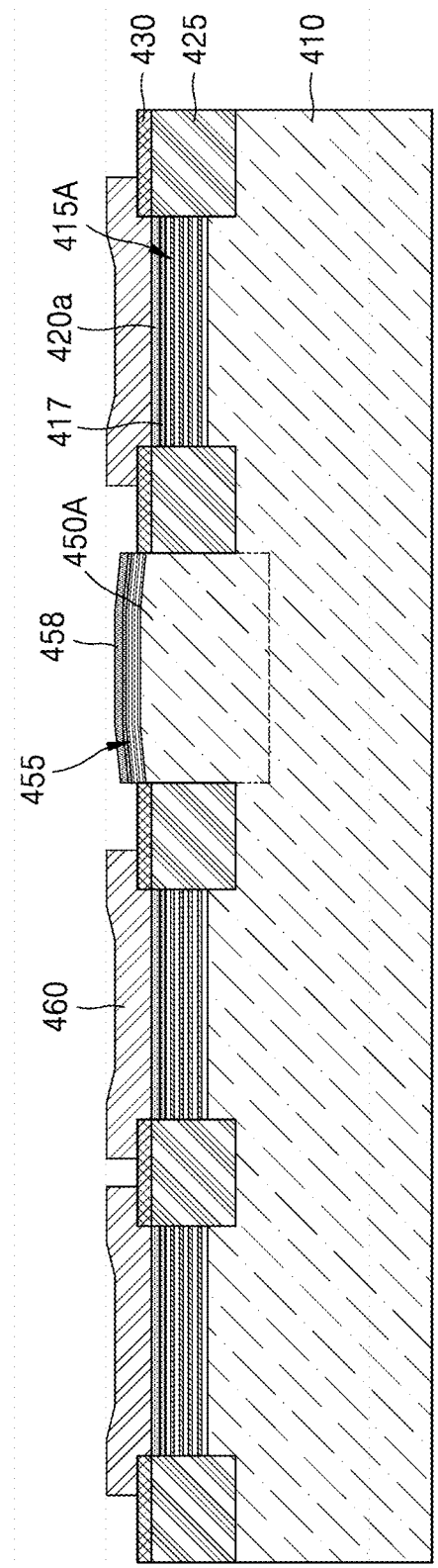

Referring to FIG. 17, a conductive material may be deposited on the structure illustrated in FIG. 16 and then, through etching, a plurality of first electrodes 460 spaced apart from each other in sub-pixel units may be formed. A first electrode 460 may be a pixel electrode that operates in sub-pixel units. The first electrode 460 may include a reflective conductive material. The first electrode 460 may include, for example, silver (Ag), gold (Au), aluminum (Al), chromium (Cr), or nickel (Ni), or an alloy thereof. The first electrode 460 may be an opaque electrode.

In this way, the plurality of first electrodes 460 apart from each other may be formed in areas corresponding to the first active layer 415A and the second active layer 455. Accordingly, a light-emitting unit in sub-pixel units may be formed.

On the other hand, when sub-pixels are electrically separated by the isolation structure 425 by ion implantation, by deactivating an edge portion of an active layer where defects may exist through ion implantation, light emission may be induced only inside the active layer. In addition, local contrast deterioration may be prevented by electrically separating pixels (sub-pixels) by an ion implantation area. The local contrast deterioration may be caused by light being emitted to unintended adjacent pixels (sub-pixels) at a pixel (sub-pixel) interface of a horizontal mesa-free structure in which no structural separation between pixels (sub-pixels) is performed. However, according to an example embodiment, current spreading to adjacent pixels (sub-pixels) may be prevented by a mesa-free isolation structure, thereby improving contrast.

Figure 18:
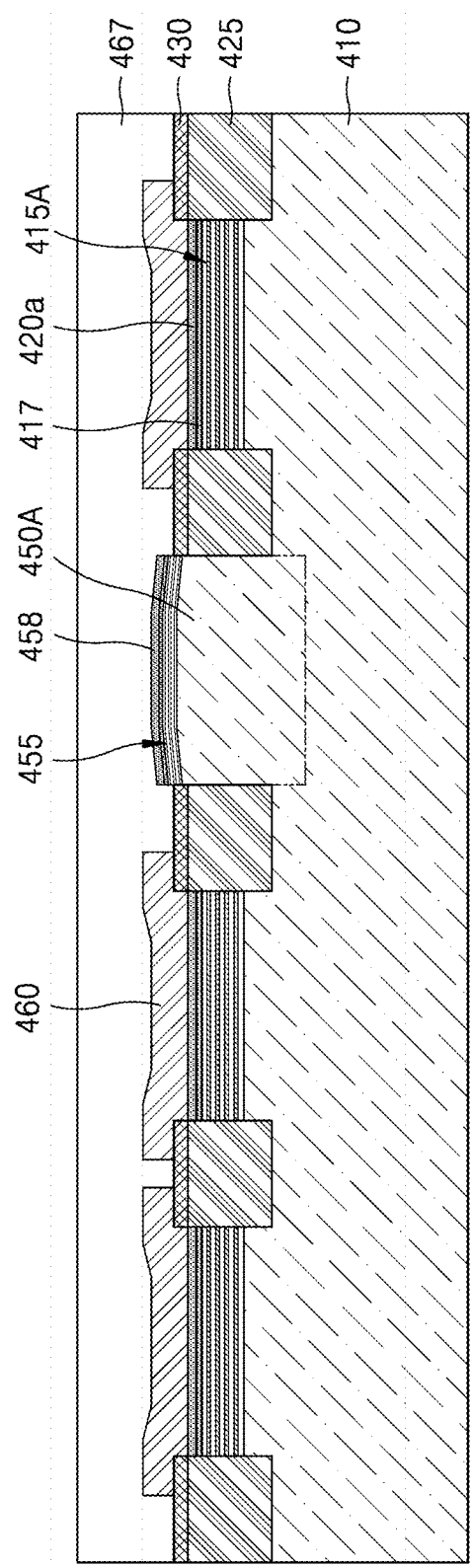

Referring to FIG. 18, a first insulating layer 467 may be formed to cover the plurality of first electrodes 460. The first insulating layer 467 may include, for example, silicon oxide ($SiO_2$), silicon nitride (SiN), aluminum oxide ($Al_2O_3$), or titanium oxide ($TiO_2$), but is not limited thereto.

Figure 19:
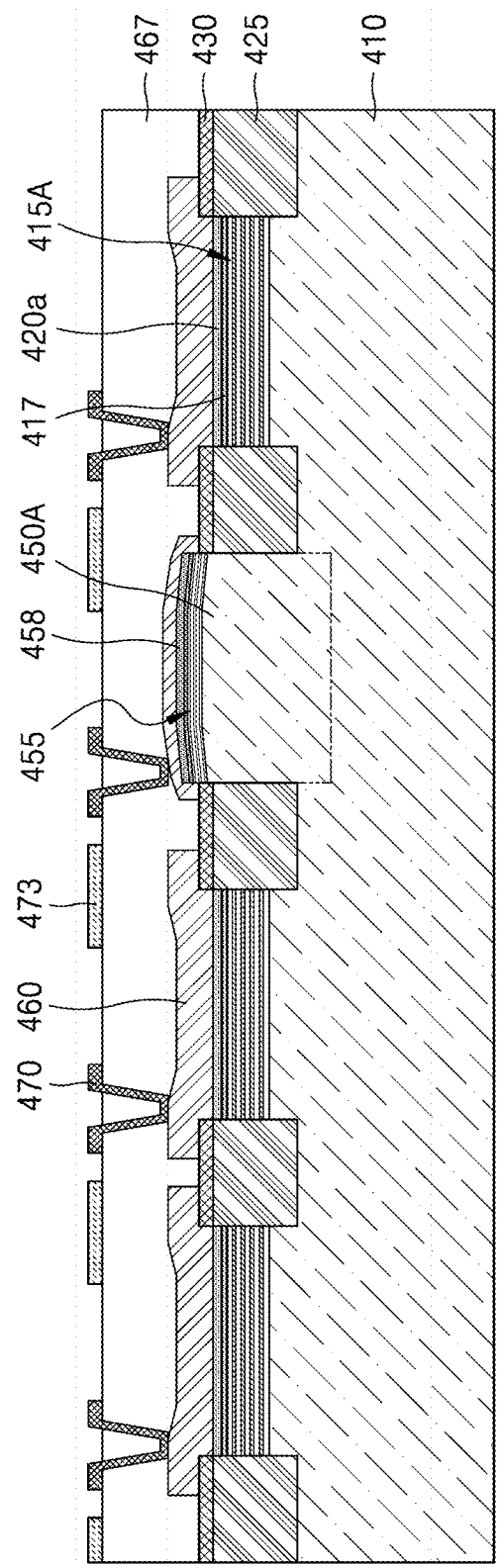

Referring to FIG. 19, the first insulating layer 467 may be etched and deposited with a conductive material to form a via 470 and an electrode pad 473. The via 470 may contact the first electrode 460.

Figure 20:
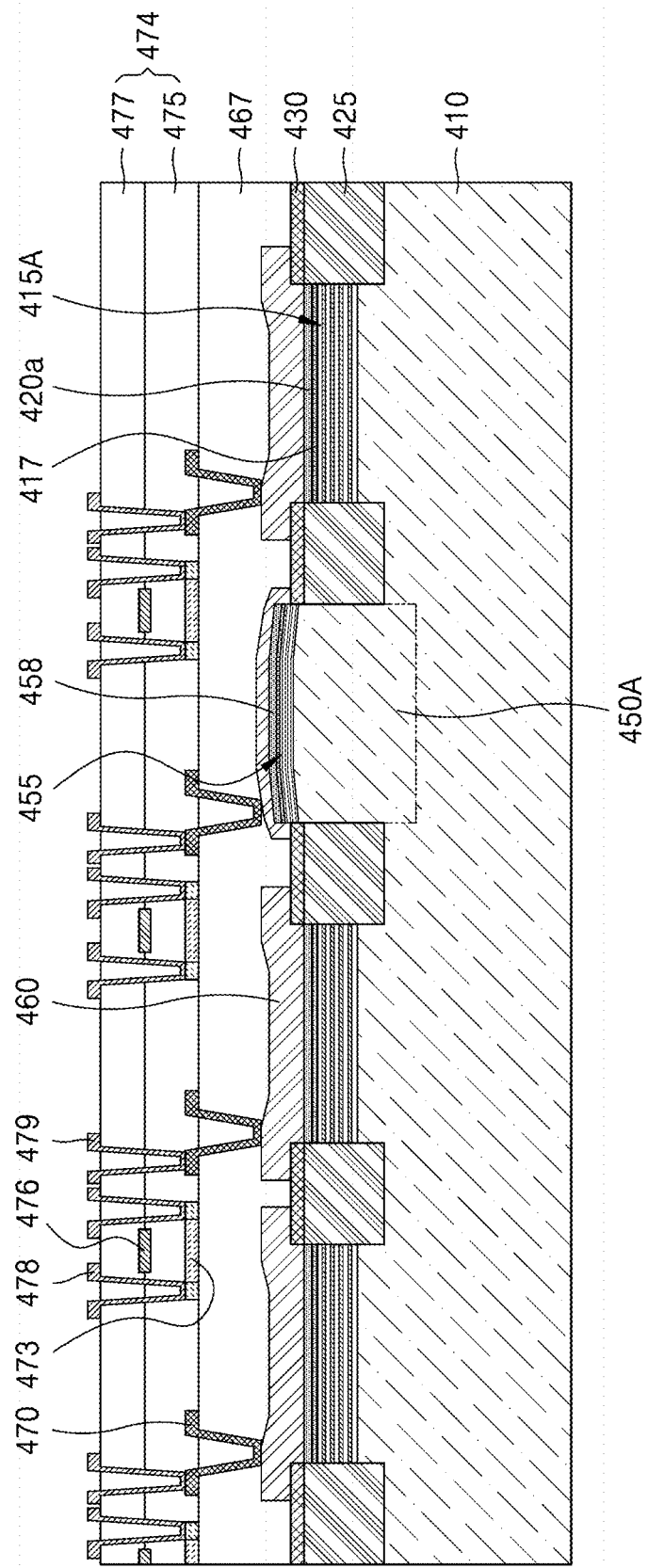

Referring to FIG. 20, a second insulating layer 475 may be formed on the first insulating layer 467 and a gate electrode 476 may be formed on the second insulating layer 475. In addition, a third insulating layer 477 may be formed on the second insulating layer 475 and the gate electrode 476. A source electrode 478 and a drain electrode 479 may be formed by etching the second insulating layer 475 and the third insulating layer 477. The gate electrode 476, the source electrode 478, and the drain electrode 479 may constitute a driving device. A method of forming a TFT as an example of the driving device has been described. The source electrode 478 may be connected to the electrode pad 473, and the drain electrode 479 may be connected to the via 470. Accordingly, a driving layer 474 may be formed.

Figure 21:
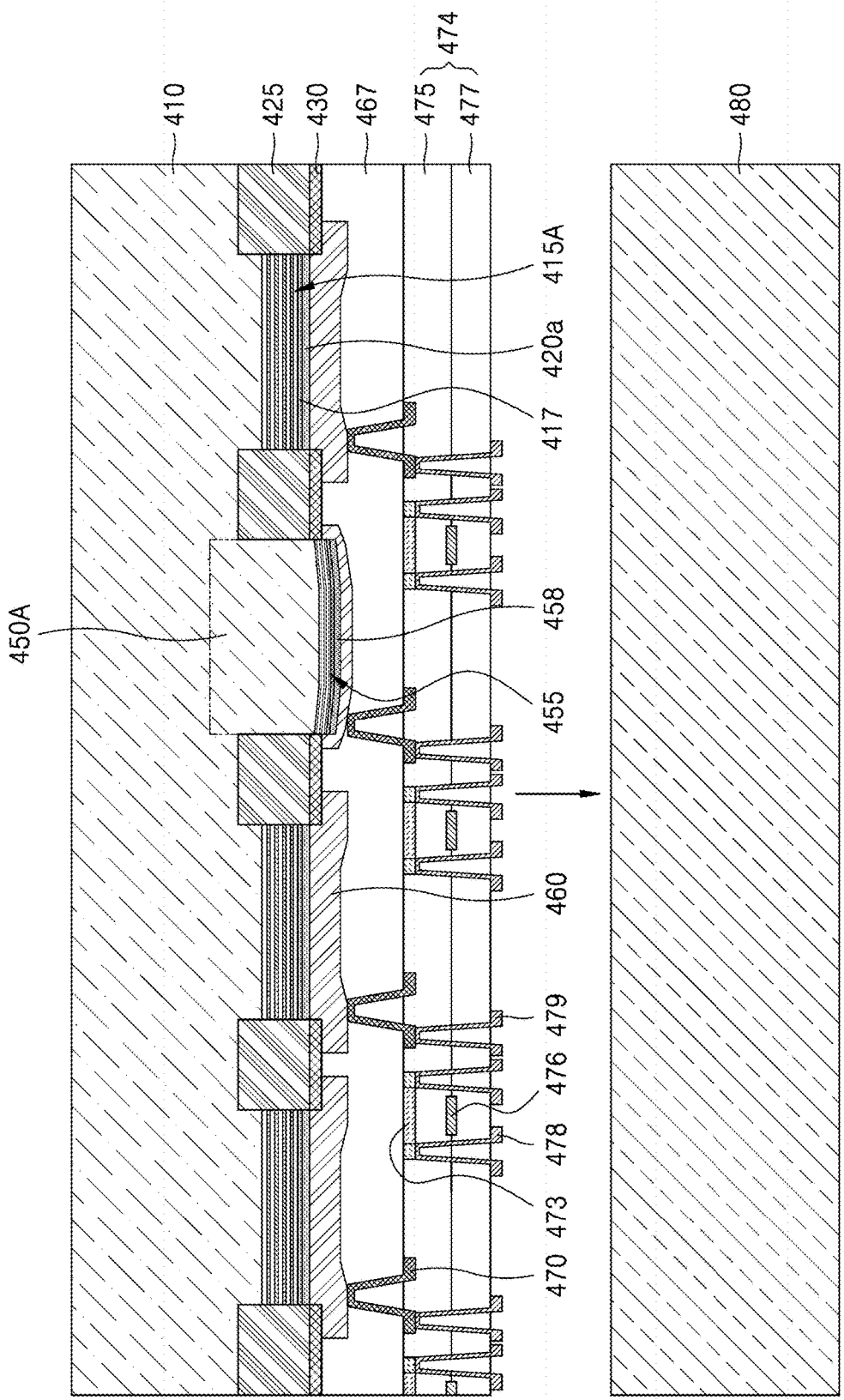
Figure 22:
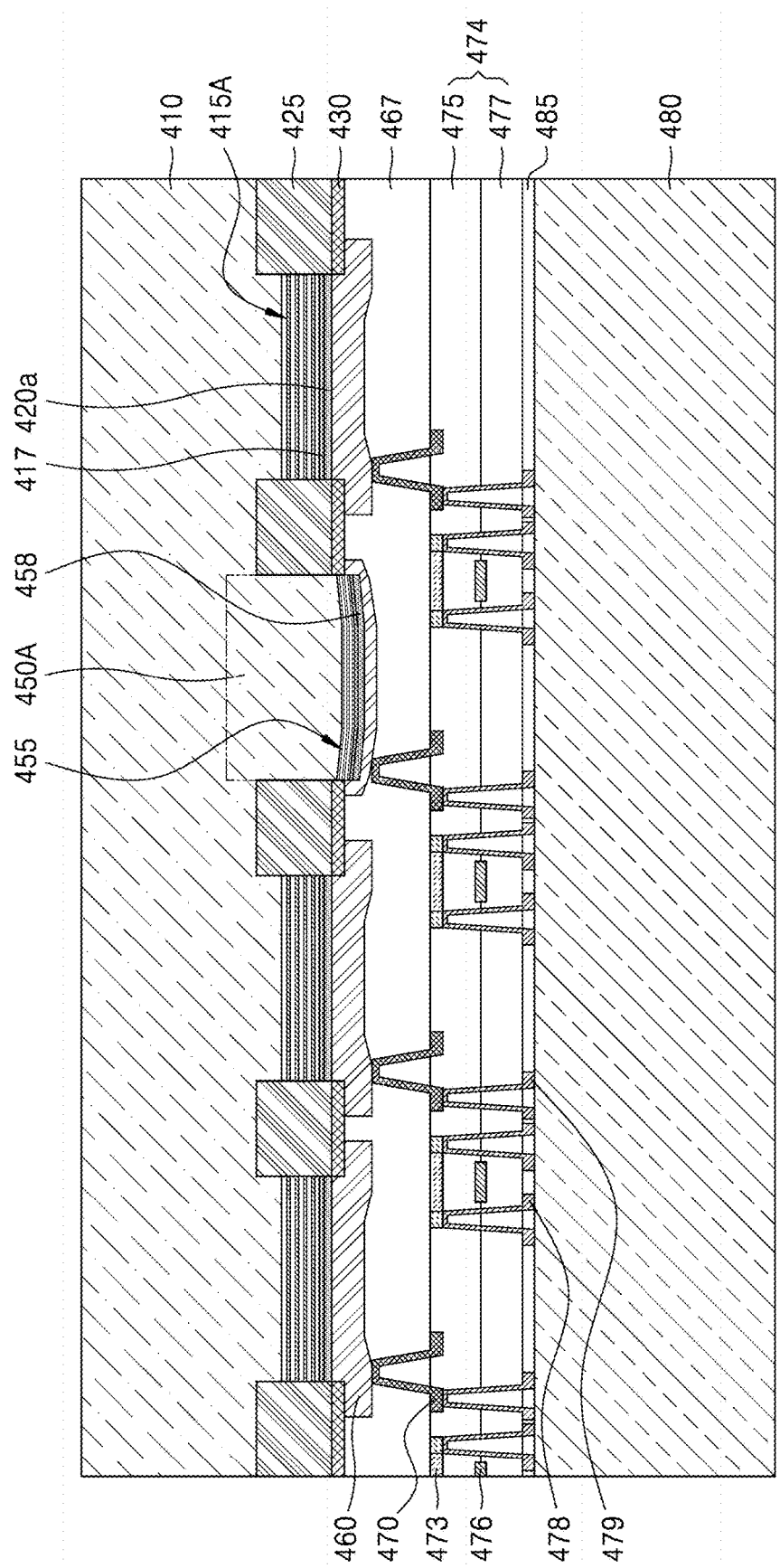

Referring to FIG. 21, the structure shown in FIG. 20 may be turned over so that the first semiconductor layer 410 is facing upward, and the structure may be arranged on a substrate 480 so that the third insulating layer 477 faces the substrate 480. The substrate 480 is to support the structure shown in FIG. 20, and, for example, a silicon substrate, a glass substrate, a sapphire substrate, or a silicon substrate coated with $SiO_2$ may be used. However, this is merely exemplary, and various materials that are easy to combine with a third insulating layer 487 may be used. Referring to FIG. 22, the substrate 480 and the third insulating layer 477 may be combined by a bonding layer 485. The bonding layer 485 may include, for example, an adhesive layer or a direct bonding layer. The substrate 480 does not require electrical connection and is for supporting a structure, and the substrate 480 and the structure may be physically bonded to each other by simple bonding. The bonding layer 485 may have a thickness, for example, in a range of about 0.1 nm to about 10 μm.

Figure 23:
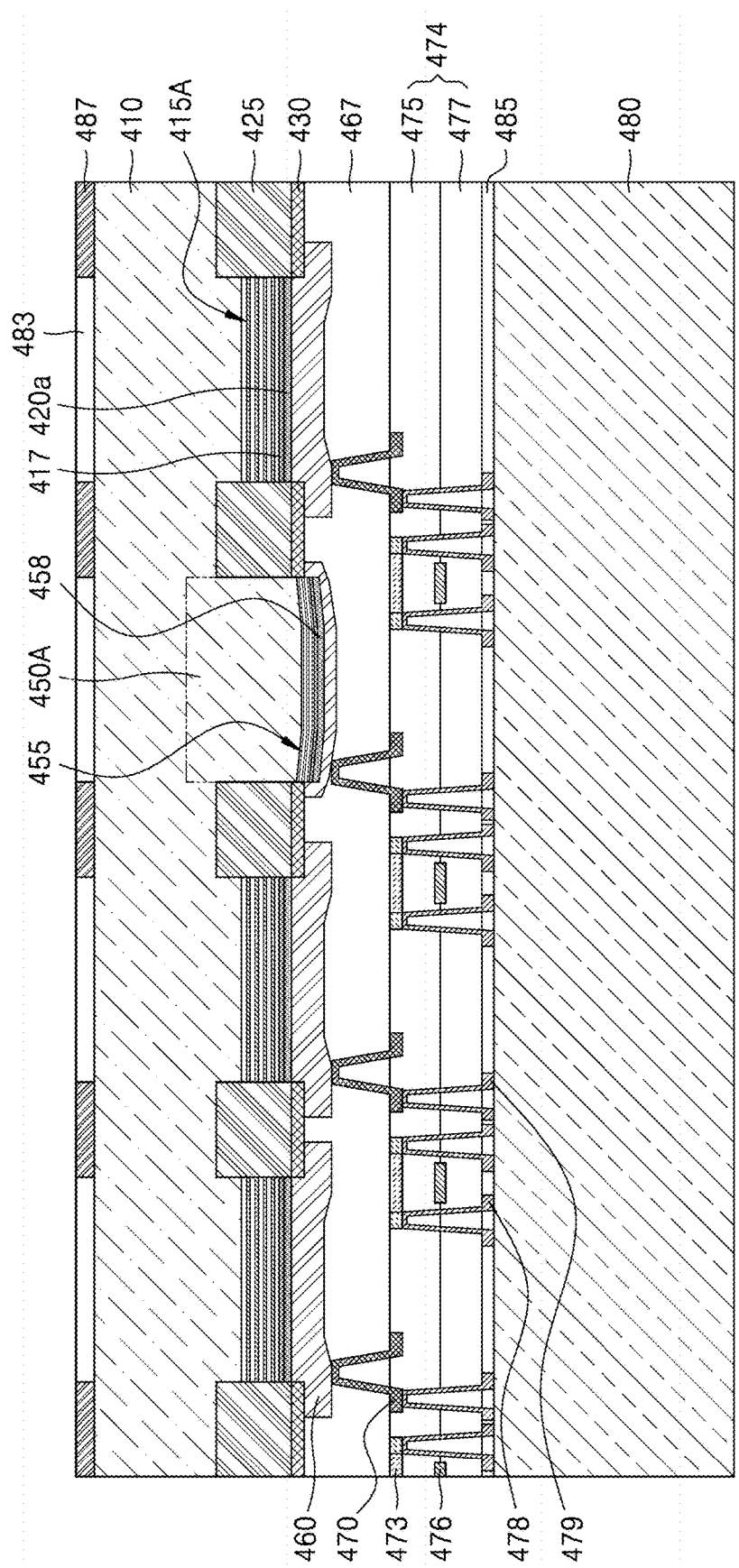

Referring to FIG. 23, a second electrode 487 may be formed on the first semiconductor layer 410 by an etching process. The second electrode 487 may be a common electrode. The second electrode 487 may be formed, for example, as an opaque electrode. In the case of an opaque electrode, a window area 483 may be formed by etching the second electrode 487 to allow light to exit. Alternatively, the second electrode 487 may be formed as a transparent electrode. When the second electrode 487 is a transparent electrode, it is not necessary to form a window area. Meanwhile, before forming the second electrode 487, a process of planarizing the first semiconductor layer 410 by a polishing process may be further added.

Figure 24:
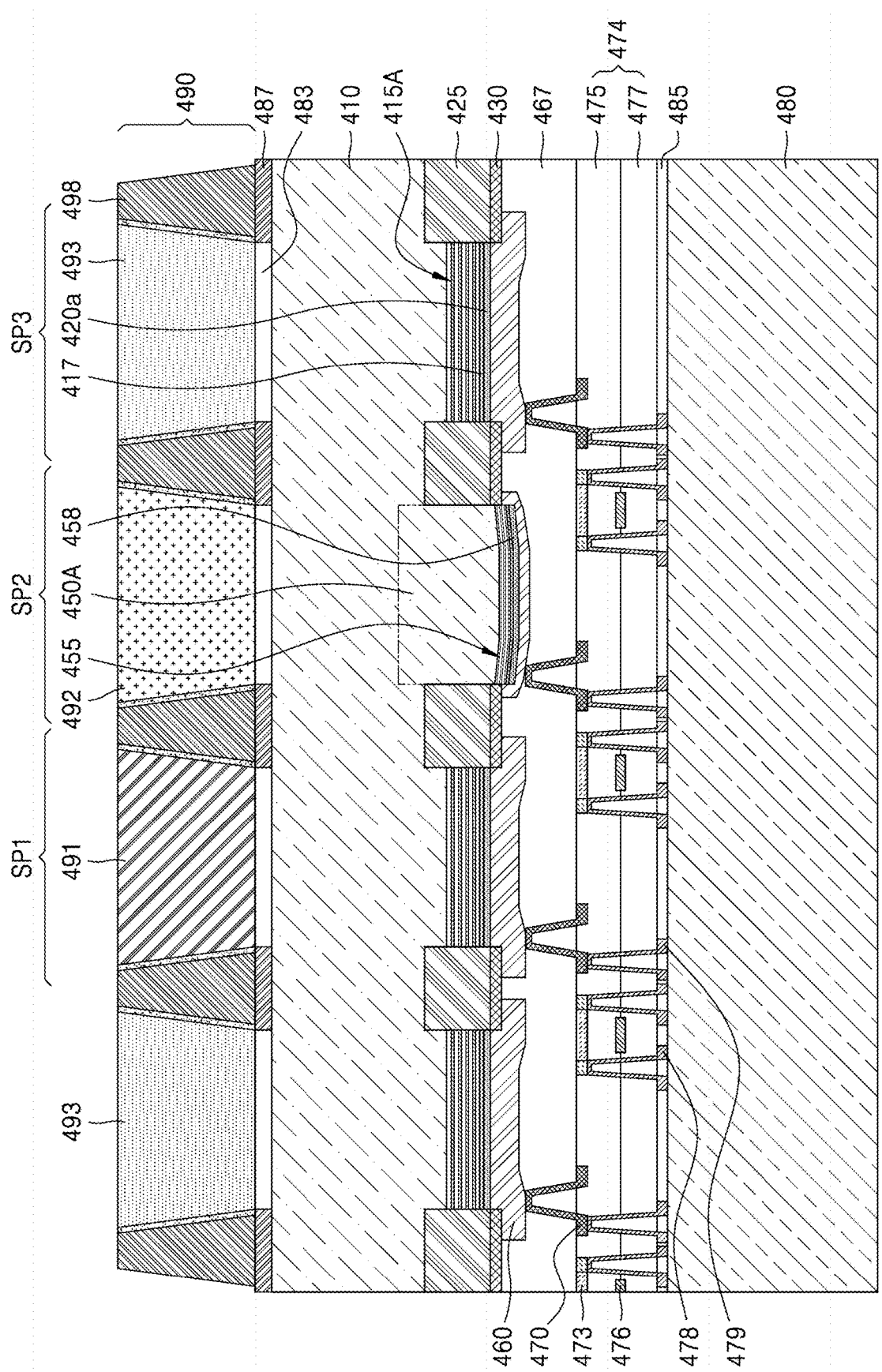

Referring to FIG. 24, a color conversion layer 490 may be formed on the second electrode 487.

A layer is applied to the second electrode 487 and etched to form a plurality of partitions 498, and a first color conversion layer 491, a second color conversion layer 492, and a third color conversion layer 493 may be formed respectively in one of the areas partitioned by the plurality of partitions 498.

The first, second, and third color conversion layers 491, 492, and 493 may be provided corresponding to the first, second, and third sub-pixels SP1, SP2, and SP3, respectively. The first, second, and third color conversion layers 491, 492, and 493 may include, for example, a blue conversion layer, a green conversion layer, and a red conversion layer, respectively.

As described above, a display apparatus according to an example embodiment may be manufactured. According to a method of manufacturing a display according to an example embodiment, a driving layer and a light-emitting layer may be formed in a monolithic manner. Further, according to the method of manufacturing a display according to an example embodiment, a vertical electrode structure without a mesa structure may be formed through a flip manufacturing process. The manufacturing process may be simplified by reducing a via hole etching process for forming an electrode, and because there is no mesa structure, a decrease in internal quantum efficiency due to a mesa structure may be prevented.

Meanwhile, in the present embodiment, the method of monolithically forming the light-emitting layer and the Thin Film Transistor (TFT) driving layer has been described, but it is also possible to manufacture a display apparatus by forming a light-emitting layer and bonding the light-emitting layer to a complementary metal-oxide semiconductor (CMOS) backplane.

FIGS. 25 to 33 are views for explaining a method of manufacturing a micro light-emitting display according to another embodiment.

Figure 25:
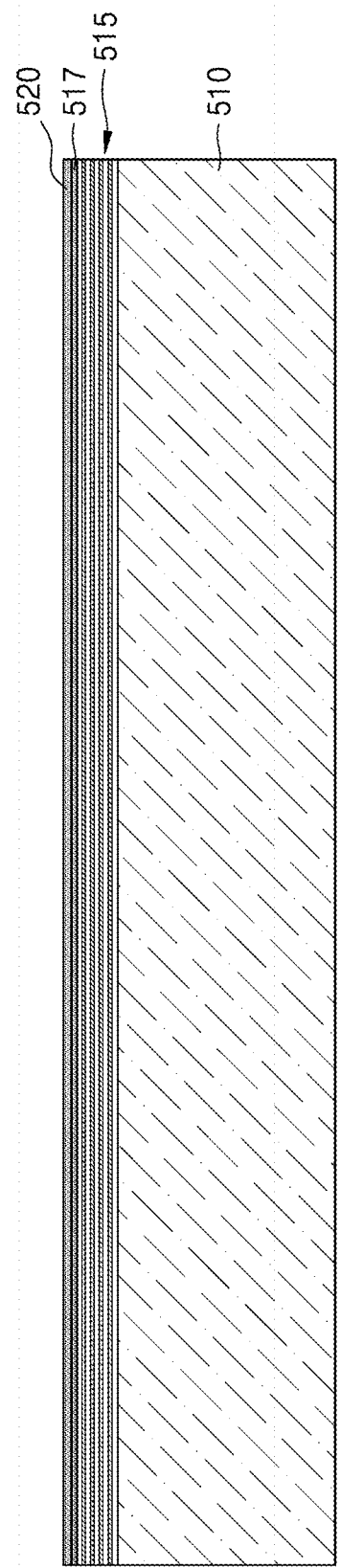
FIGS. 25 to 33 are views illustrating a method of manufacturing a micro light-emitting display apparatus according to another example embodiment.

Referring to FIG. 25, a first layer 515 is formed on a first semiconductor layer 510. The first semiconductor layer 510 may include an n-type semiconductor layer. However, in some cases, the first semiconductor layer 510 may include a p-type semiconductor layer. For example, the first semiconductor layer 510 may include n-type GaN. The first layer 515 is a layer on which an active layer is to be formed, and may include, for example, GaN. A second semiconductor layer 520 is formed on the first layer 515. The second semiconductor layer 520 may include, for example, a p-type semiconductor layer. The second semiconductor layer 520 may include, for example, p-type GaN.

An electron blocking layer 517 may be further formed between the first layer 515 and the second semiconductor layer 520. The electron blocking layer 517 may include, for example, AlGaN.

Figure 26:
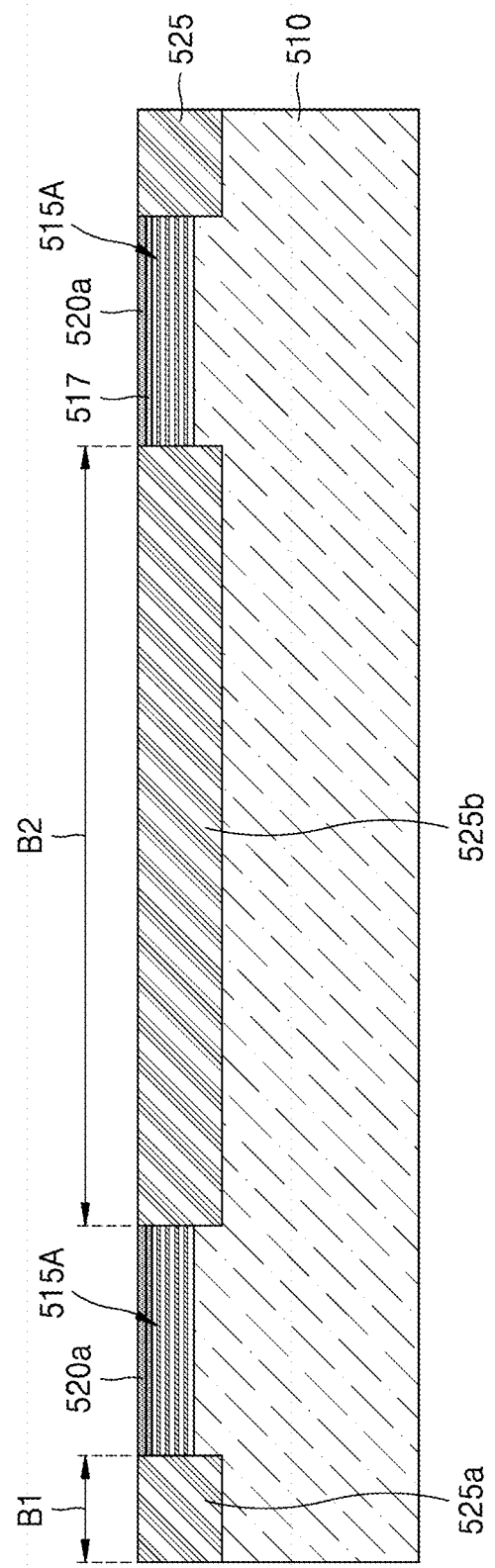

Referring to FIG. 26, an isolation structure 525 may be formed on the first layer 515, the electron blocking layer 517, and the second semiconductor layer 520 by using a mask. The mask may be, for example, an ion implantation mask. For example, the isolation structure 525 may be formed by implanting ions into certain areas of the first layer 515 and the second semiconductor layer 520. The isolation structure 525 may include, for example, a first isolation structure 525a having a first width B1 and a second isolation structure 525b having a second width B2. The second width B2 may be greater than the first width B1.

A plurality of first active layers 515A, spaced apart from each other by the isolation structure 525, may be formed. Further, a plurality of second semiconductor layers 520a spaced apart from each other may be formed by the isolation structure 525. Each of the plurality of first active layers 515A and each of the plurality of second semiconductor layers layer 520a provided apart from each other may define a sub-pixel area. Each of the plurality of first active layers 515A may include a multi-quantum well structure in which InGaN layers and GaN layers are alternately stacked. The isolation structure 525 may form a micro light-emitting structure array, for example, a micro LED array.

Figure 27:
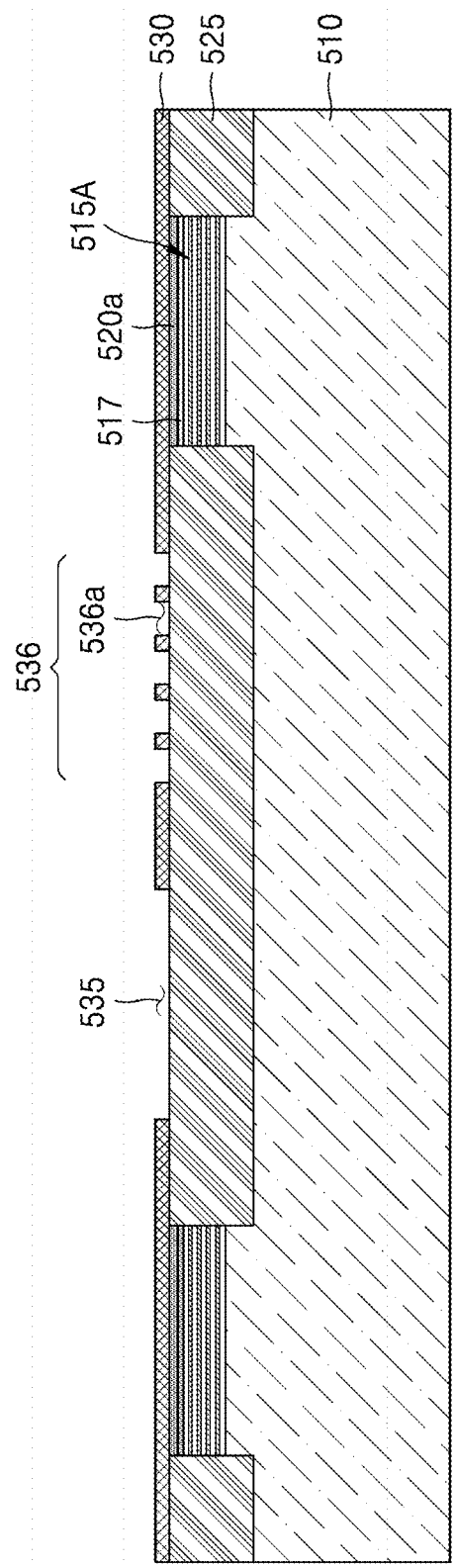

Referring to FIG. 27, a second layer 530 may be deposited on the second semiconductor layers 520a and the isolation structure 525. The second layer 530 may be formed through a photoresist and etching process. The second layer 530 may include, for example, an insulating material. The second layer 530 may function as a current blocking layer. The second layer 530 is patterned so that a first area 535 and a second area 536 of the second isolation structure 525b are opened. The first area 535 may be an area where a rod semiconductor layer is to be formed, and the second area 536 may be an area where a nano rod semiconductor layer is to be formed. The second area 536 may have a plurality of groove structures 536a formed in the second layer 530. The second area 536 may have a width of, for example, a nanometer size.

Figure 28:
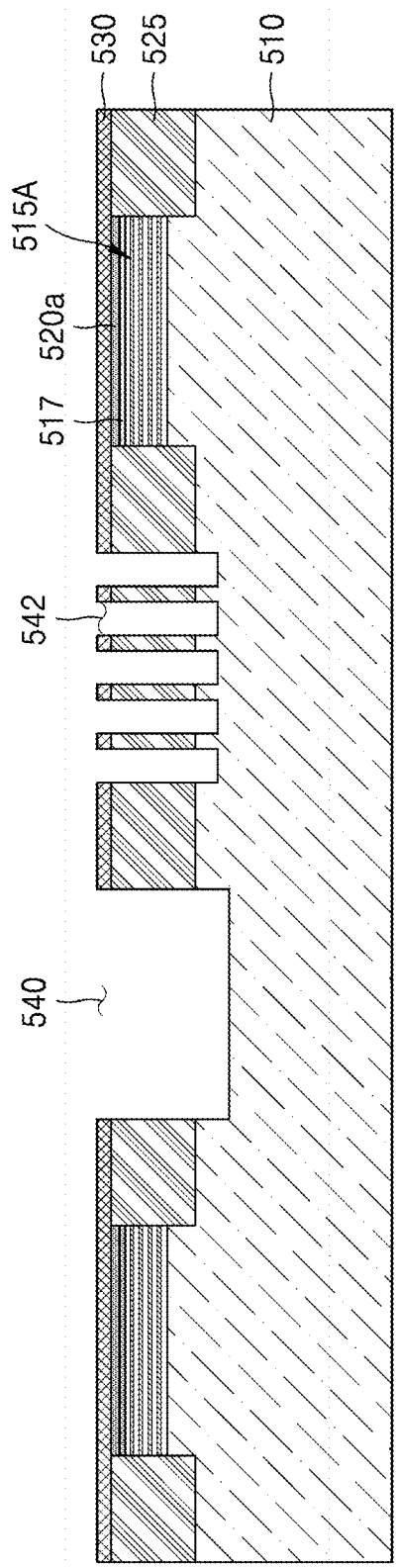

Referring to FIG. 28, a first regrowth area 540 may be formed by etching the exposed first area 535 of the second isolation structure 525b. The first regrowth area 540 may be formed to a depth penetrating the second isolation structure 525b. Furthermore, a second regrowth area 542 may be formed by etching the second area 536 of the second isolation structure 525b. The second regrowth area 542 may include a plurality of areas spaced apart from each other by the isolation structure 525.

Figure 29:
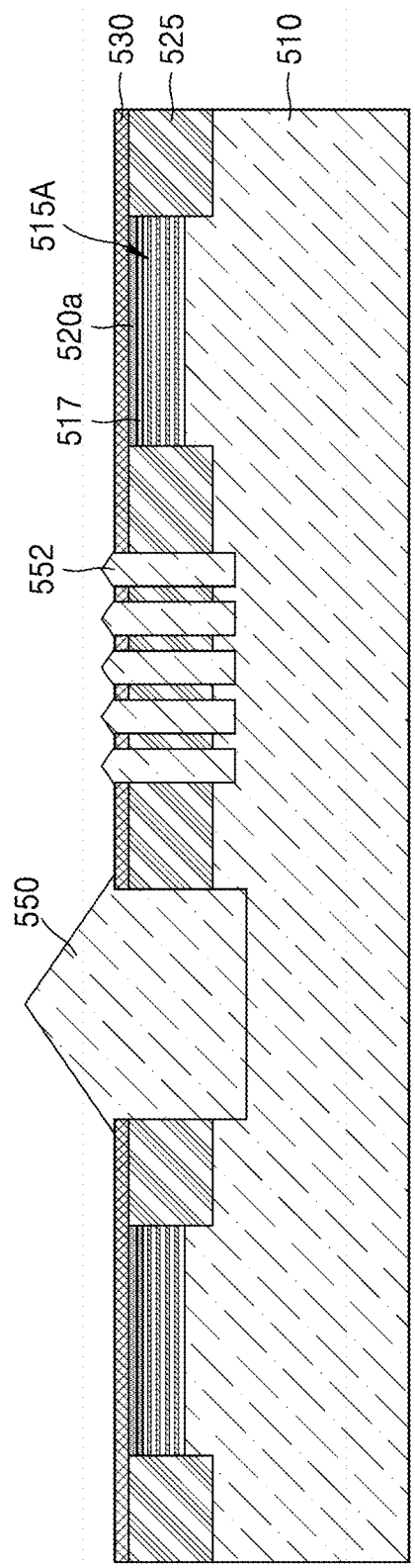

Referring to FIG. 29, a semiconductor layer 550 is regrown in the first regrowth area 540. In addition, a semiconductor layer 552 may be regrown in a second regrowth area 541. The semiconductor layers 550 and 552 may include, for example, the same material as the material of the first semiconductor layer 510. The semiconductor layers 550 and 552 may include, for example, n-type GaN. A thickness of a central portion of the semiconductor layers 550 and 552 may be greater than that of a peripheral portion according to a difference in growth rate.

Figure 30:
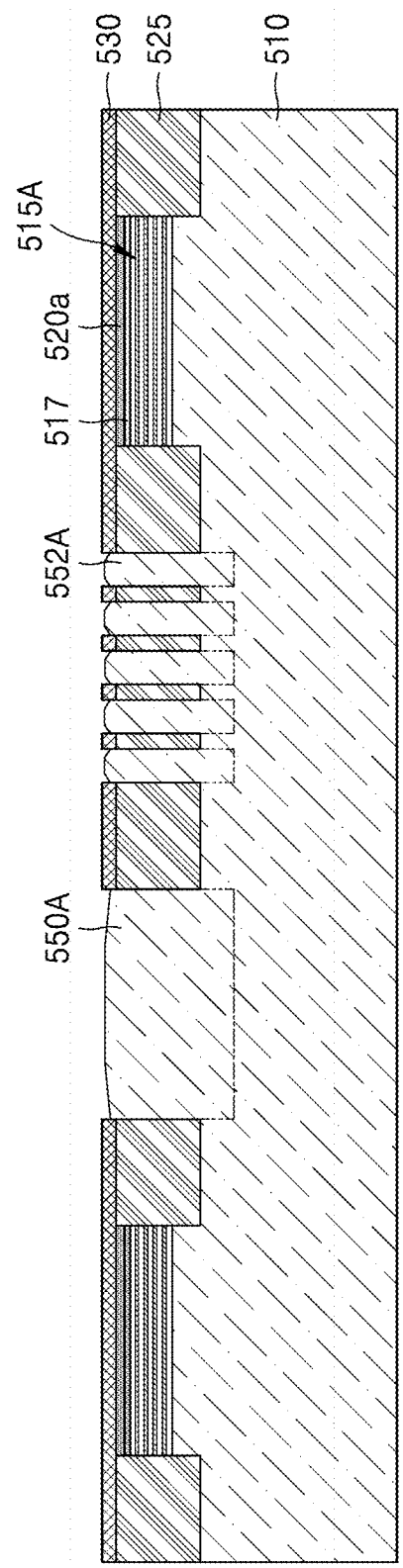

Referring to FIG. 30, the semiconductor layer 550 may be planarized to form a rod semiconductor layer 550A. In addition, the semiconductor layer 552 may be planarized to form a nanorod semiconductor layer 552A. The rod semiconductor layer 550A and the nanorod semiconductor layer 552A may be planarized by etching with, for example, an etching solution of KOH or TMAH. Because the rod semiconductor layer 550A and the nano rod semiconductor layer 552A are substantially the same as those described with reference to FIG. 15, a detailed description thereof will not be given herein. In addition, the nanorod semiconductor layer 552A may have the structure described with reference to FIG. 4.

Figure 31:
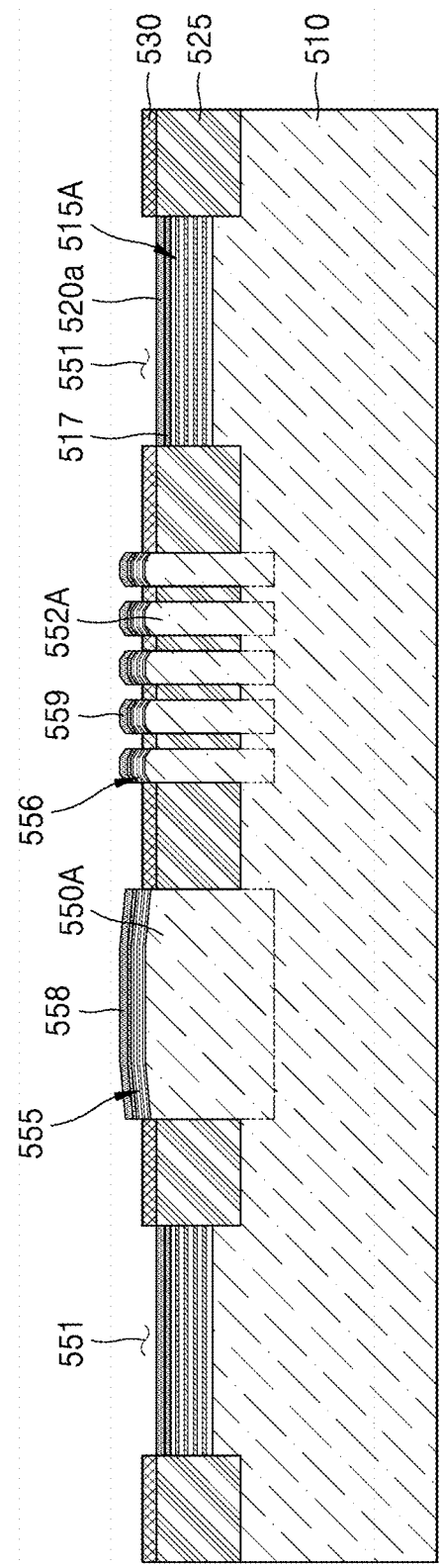

Referring to FIG. 31, a second active layer 555 may be formed on the rod semiconductor layer 550A, and a third semiconductor layer 558 may be formed on the second active layer 555. The second active layer 555 may have an MQW structure or an SQW structure. For example, the second active layer 555 may include a multi-quantum well structure in which InGaN layers and GaN layers are alternately stacked. The second active layer 555 may be configured to emit green light by adjusting, for example, the uniformity of composition and thickness of In.

A third active layer 556 may be formed on the nanorod semiconductor layer 552A, and a fourth semiconductor layer 559 may be formed on the third active layer 556.

The third semiconductor layer 558 and the fourth semiconductor layer 559 may include a p-type semiconductor. The third semiconductor layer 558 and the fourth semiconductor layer 559 may include a III-V group p-type semiconductor, for example, p-GaN.

After the third semiconductor layer 558 and the fourth semiconductor layer 559 are formed, the second layer 530 may be patterned to expose a plurality of third areas 551 in which the first active layers 515A are formed.

Figure 32:
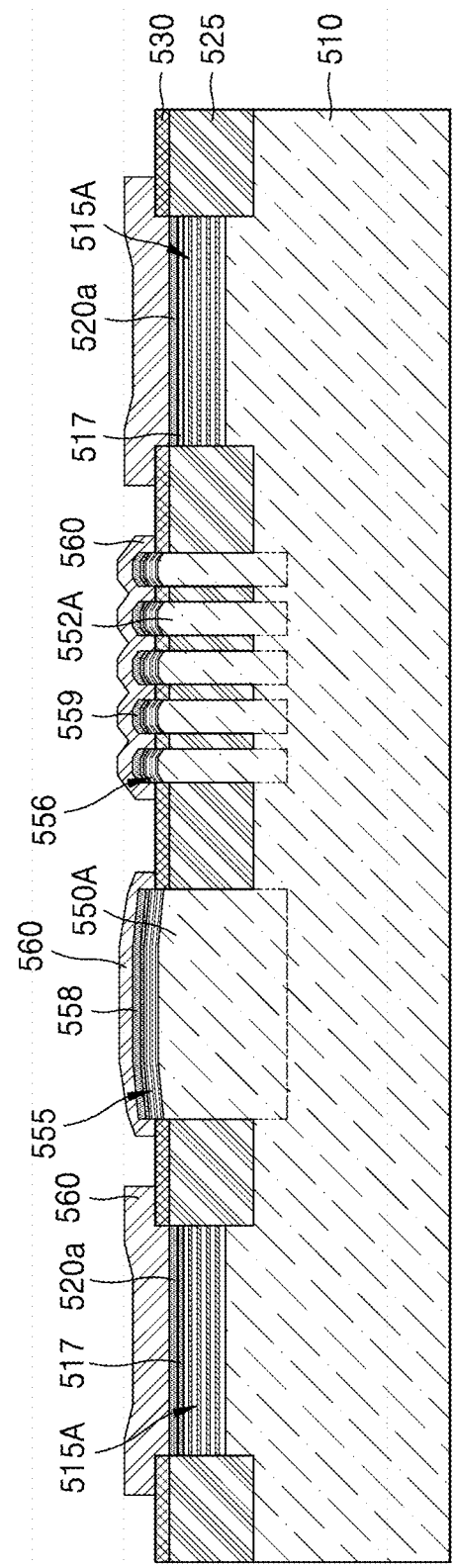

Referring to FIG. 32, a conductive material may be deposited on the structure illustrated in FIG. 32 and then, through etching, first electrodes 560 spaced apart from each other in sub-pixel units may be formed. A first electrode 560 may be a pixel electrode that operates in sub-pixel units. The first electrode 560 may include a reflective conductive material. The first electrode 560 may include, for example, Ag, Au, Al, Cr, or Ni, or an alloy thereof. The first electrode 560 may be an opaque electrode.

In this way, the first electrodes 560 apart from each other may be formed in areas corresponding to the first active layer 515A, the second active layer 555, and the third active layer 556. Accordingly, a light-emitting unit in sub-pixel units may be formed.

Figure 33:
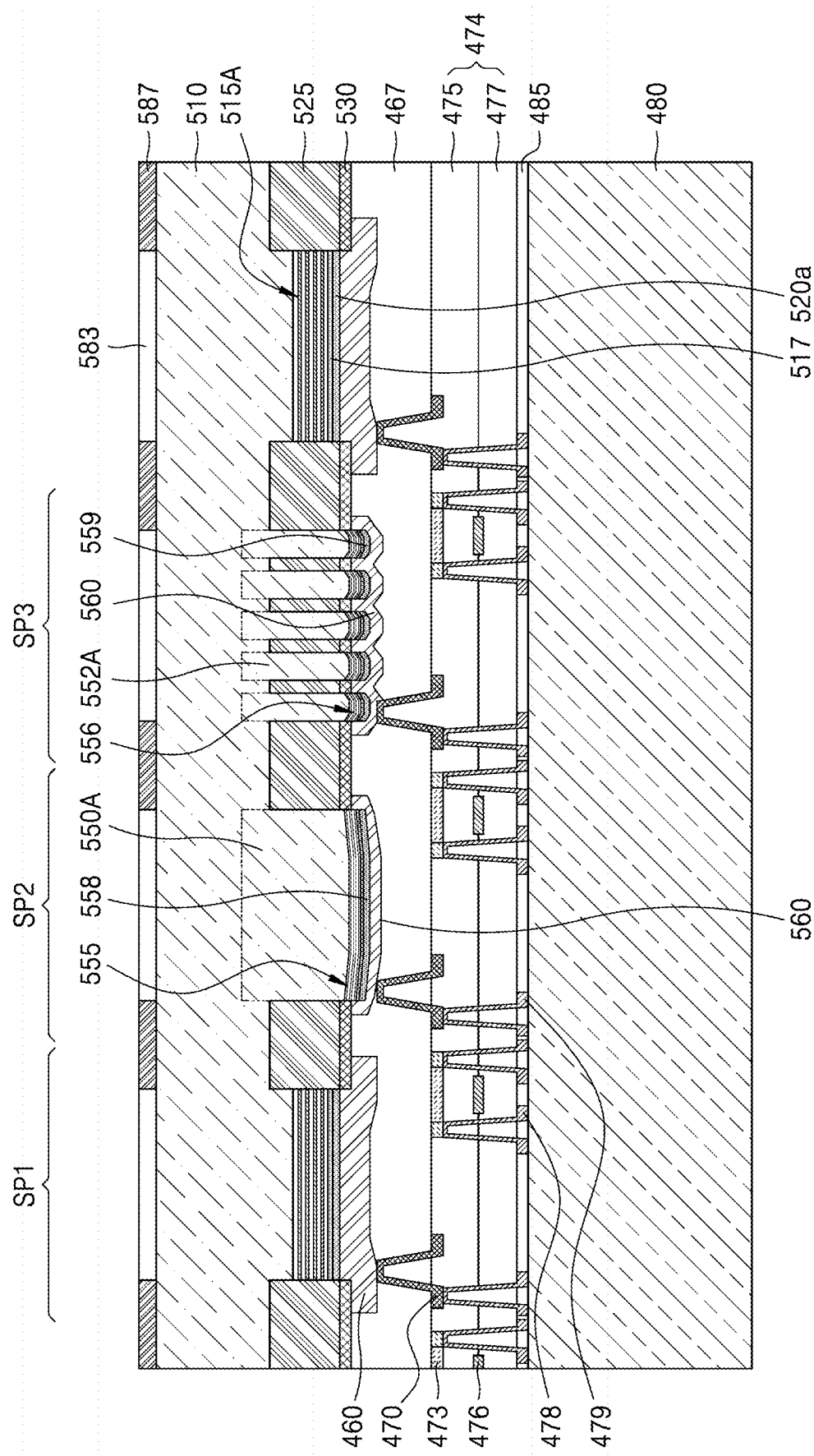

Referring to FIG. 33, a driving layer for driving a light emitting unit may be combined to the structure shown in FIG. 32. In FIG. 33, the process of forming the driving layer 474 on the structure shown in FIG. 32 is substantially the same as those described with reference to FIGS. 17 to 24, and thus a detailed description thereof will not be given herein. In FIG. 33, components using the same reference numerals as in FIGS. 17 to 24 may have substantially the same configuration and function as those described with reference to FIGS. 17 to 24. The structure shown in FIG. 32 may be turned over so that the first semiconductor layer 510 is upward, and the structure may be arranged on the substrate 480 so that the third insulating layer 477 faces the substrate 480.

In addition, a second electrode 587 may be formed on the first semiconductor layer 510 by an etching process. The second electrode 587 may be a common electrode. The second electrode 587 may be formed, for example, as an opaque electrode. In the case of an opaque electrode, a window area 583 may be formed by etching the second electrode 587 to allow light to exit. Alternatively, the second electrode 587 may be formed as a transparent electrode. When the second electrode 587 is a transparent electrode, it is not necessary to form a window area.

In the present embodiment, blue light may be emitted from the first active layer 515A, green light may be emitted from the second active layer 555, and red light may be emitted from the third active layer 556. Accordingly, a color image may be displayed using each of the color lights emitted from the first active layer 515A, the second active layer 555, and the third active layer 556. In the present embodiment, it is not necessary to separately provide a color conversion layer. Therefore, it is possible to simplify a method of manufacturing a micro light-emitting display apparatus.

Meanwhile, a method of manufacturing a display according to an example embodiment may provide a method of manufacturing a mesa-free flip.

Figure 34:
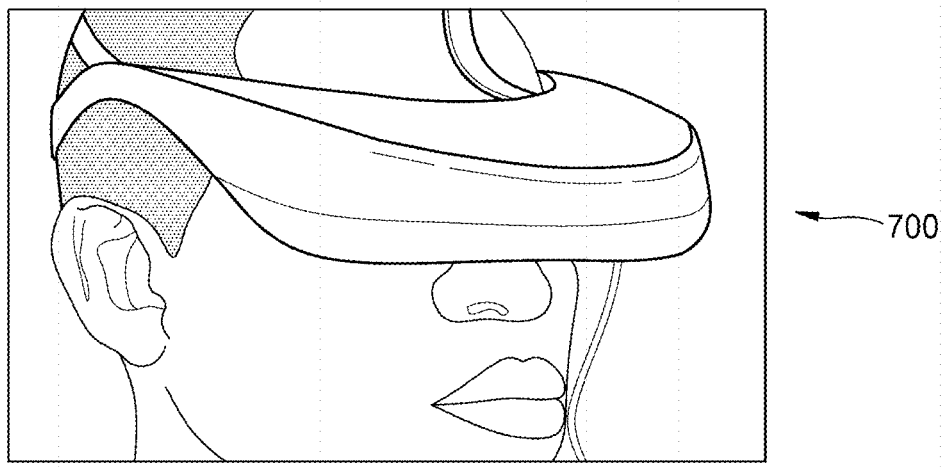
FIGS. 34 to 40 are views illustrating example applications of a micro light-emitting display apparatus according to various example embodiments.
Figure 35:
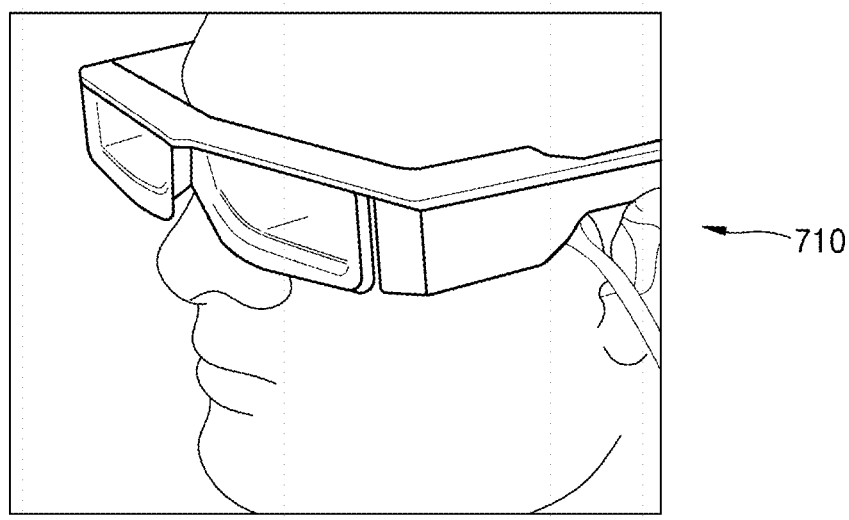
Figure 36:
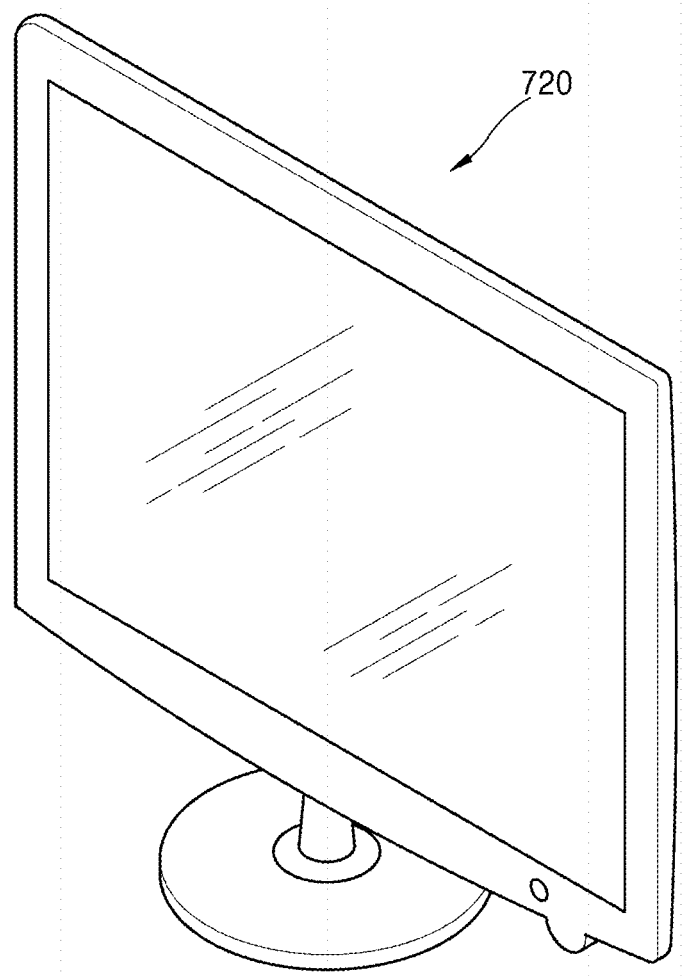
Figure 37:
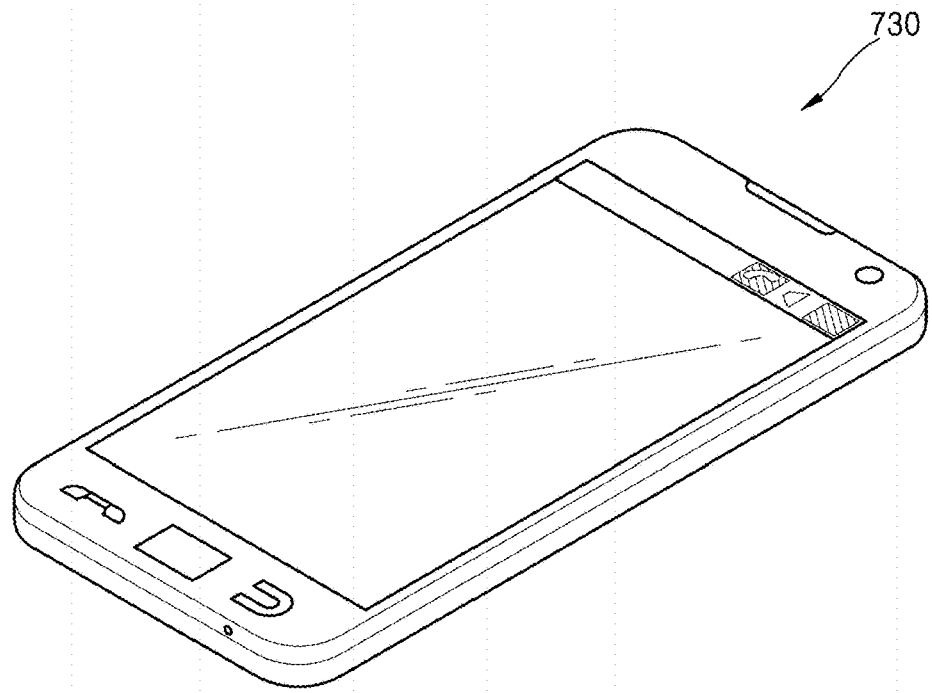
Figure 38:
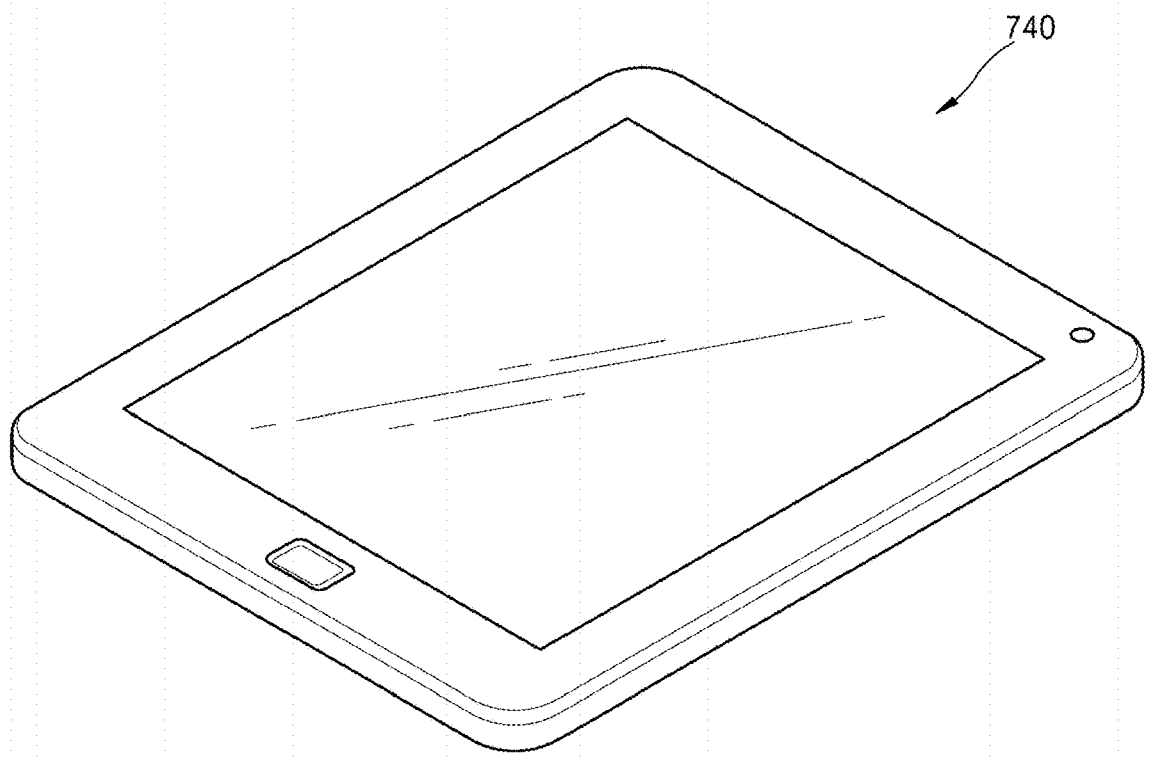

The micro light-emitting display apparatus according to the above-described embodiments may be applied to display apparatuses of various sizes and uses without limitation. For example, FIGS. 34 to 40 show example applications of various display apparatuses. As shown in FIG. 34, a micro light-emitting display apparatus according to various embodiments may be applied to a head mounted display (HMD) 700. As shown in FIG. 35, the micro light-emitting display apparatus according to various embodiments may be applied to a small display panel used in a glasses-type display or a goggle-type display 710. As shown in FIG. 36, the micro light-emitting display apparatus may be applied to a display panel of a television, a smart television, or a computer 720. As shown in FIG. 37, the micro light-emitting display apparatus according to various embodiments may be applied to a display panel of a mobile phone or a smart phone 730. As shown in FIG. 38, the micro light-emitting display apparatus according to various embodiments may be applied to a display panel of a tablet or a smart tablet 740.

Figure 39:
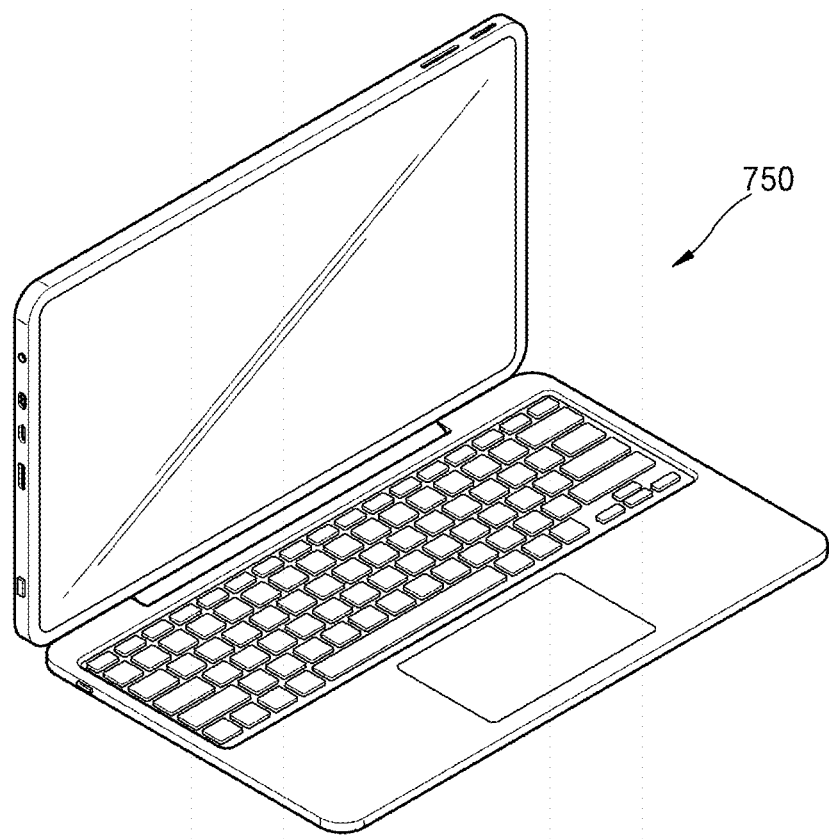
Figure 40:
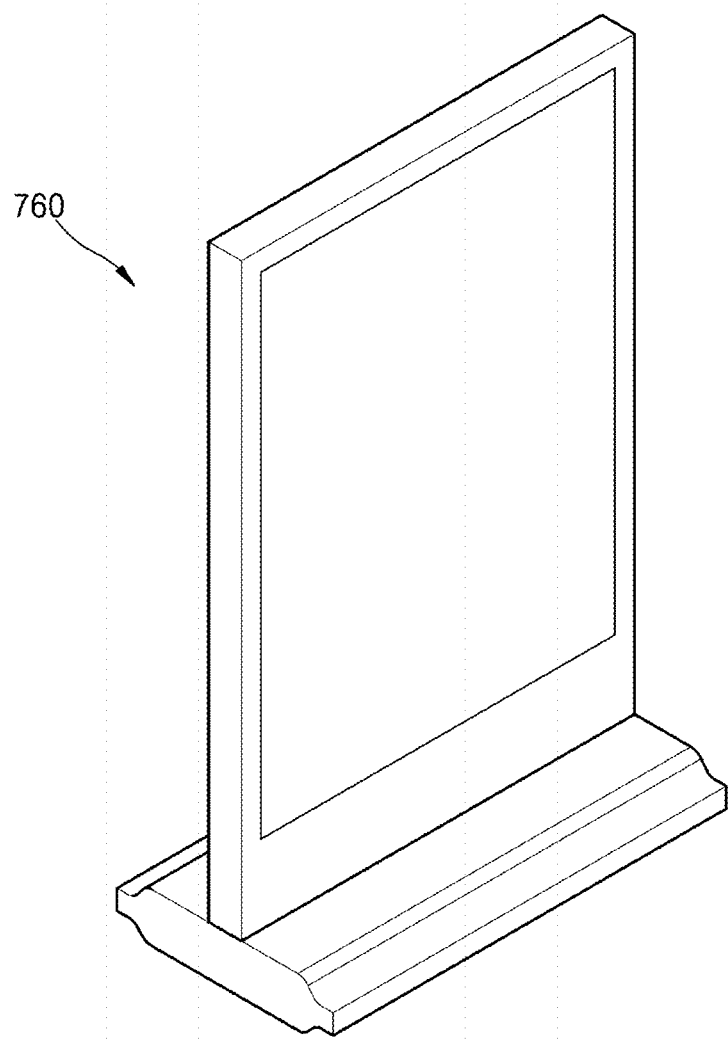

In addition, the micro light-emitting display apparatus according to various embodiments may be applied to a display panel of a laptop computer 750 as shown in FIG. 39, and may also be applied to a large display panel used in signage 760, a large electronic signboard, a theater screen, and the like as shown in FIG. 40.

Although the micro light-emitting display apparatus according to various embodiments and the method of manufacturing the same has been described with reference to the embodiments shown in the drawings, they are only examples. Descriptions of features or aspects within each embodiment should typically be considered as available for other similar features or aspects in other embodiments. It should be understood that embodiments described herein should be considered in a descriptive sense only and not for purposes of limitation. The scope of rights is indicated in the claims rather than the above description, and all differences within the scope of equivalents should be construed as being included in the scope of rights.

An example embodiment may implement a display that displays a high-resolution color image using a micro light-emitting device. A display apparatus according to an example embodiment may simplify the display apparatus by using a micro light-emitting structure that directly displays a green color without converting blue light into green light.

In a method of manufacturing a micro light-emitting device according to an example embodiment, a light-emitting structure that is separated by sub-pixel units through an isolation structure and emits green light or red light through regrowth of a semiconductor layer may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light-emitting display apparatus comprising:
    a first semiconductor layer;
    an isolation structure provided on the first semiconductor layer and configured to define a plurality of sub-pixels each configured to emit light;
    a first light-emitting unit comprising a first active layer provided in a first sub-pixel among the plurality of sub-pixels, and a second semiconductor layer provided on the first active layer, the first active layer having a quantum well structure provided directly on the first semiconductor layer; and
    a second light-emitting unit comprising a rod semiconductor layer provided in a second sub-pixel among the plurality of sub-pixels, a second active layer provided on the rod semiconductor layer, and a third semiconductor layer provided on the second active layer,
    wherein the first active layer is configured to emit blue light and the second active layer is configured to emit green light.

2. The micro light-emitting display apparatus of claim 1, wherein the rod semiconductor layer comprises:
    a first portion having a constant width viewed along a height direction and a second portion where the width changes viewed along the height direction, wherein the second portion comprises a first inclined surface, a second inclined surface facing the first inclined surface, and an upper surface between the first inclined surface and the second inclined surface.

3. The micro light-emitting display apparatus of claim 2, wherein an angle between a surface extending from the first inclined surface and the upper surface ranges from about 47 degrees to about 57 degrees.

4. The micro light-emitting display apparatus of claim 2, wherein the rod semiconductor layer includes a same material as the first semiconductor layer.

5. The micro light-emitting display apparatus of claim 2, wherein a width D1 of the upper surface satisfies the following equation: $D1=D-2\times(h1/\tan \beta)$, where h1 is a height of the second portion, $\beta$ is an angle between the surface extending from the first inclined surface and the upper surface and D is a width of the first portion.

6. The micro light-emitting display apparatus of claim 2, wherein an aspect ratio (H/D) of the first portion satisfies $0.05<H/D<20$, where H is a height of the first portion and D is a width of the first portion.

7. The micro light-emitting display apparatus of claim 6, wherein the height H of the first portion satisfies $0.5\ \mu m<H<20\ \mu m$.

8. The micro light-emitting display apparatus of claim 6, wherein the width D of the first portion satisfies $0.05\ \mu m<D<2\ \mu m$.

9. The micro light-emitting display apparatus of claim 5, wherein the height h1 of the second portion is about 100 nm or less.

10. The micro light-emitting display apparatus of claim 1, further comprising a third light-emitting unit configured to emit red light.

11. The micro light-emitting display apparatus of claim 10, wherein the third light-emitting unit comprises a plurality of nanorod semiconductor layers arranged apart from each other on the first semiconductor layer, a third active layer, among a plurality of third active layers, provided on each of the plurality of nanorod semiconductor layers, and a fourth semiconductor layer, among a plurality of fourth semiconductor layer, provided on each of the third active layers.

12. The micro light-emitting display apparatus of claim 11, wherein each of the nanorod semiconductor layers and each of the third active layers have a width in a range of about 10 nm to about 100 nm.

13. The micro light-emitting display apparatus of claim 11, wherein a pitch between the nanorod semiconductor layers is in a range of about 20 nm to about 300 nm.

14. The micro light-emitting display apparatus of claim 11, wherein each of the nanorod semiconductor layers include an inclined surface and a flat surface.

15. The micro light-emitting display apparatus of claim 1, further comprising fourth light-emitting unit configured to emit blue light, and a color conversion layer configured to convert the blue light emitted from the fourth light-emitting unit into red light.

16. The micro light-emitting display apparatus of claim 1, wherein the isolation structure comprises an ion implantation area.

17. A micro light-emitting display apparatus comprising:
    a first semiconductor layer;
    an isolation structure provided on the first semiconductor layer;
    a first light-emitting unit provided on an upper surface of the first semiconductor to form a first sub-pixel, the first light-emitting unit including a first active layer and a second semiconductor layer provided on the first active layer, the first active layer having a quantum well structure provided directly on the first semiconductor layer;
    a second light-emitting unit provided in a first area of the isolation structure to form a second sub-pixel, the second light-emitting unit including a rod semiconductor layer, a second active layer provided on the rod semiconductor layer, and a third semiconductor layer provided on the second active layer,
    wherein the first active layer is configured to emit first light and the second active layer is configured to emit second light.

18. The micro light-emitting display apparatus of claim 17, further comprising:
    a third light-emitting unit provided in a second area of the isolation structure to form a third sub-pixel, the third light-emitting unit including a plurality of nanorod semiconductor layers, a third active layer, among a plurality of third active layers, provided on each of the plurality of nanorod semiconductor layers, and a fourth semiconductor layer, among a plurality of fourth active layers, provided on each of the third active layers,
wherein the third active layer is configured to emit third light.

* * * * *